(12) United States Patent
Yamaguchi

(10) Patent No.: US 9,190,445 B2
(45) Date of Patent: Nov. 17, 2015

(54) SEMICONDUCTOR DEVICE

(71) Applicant: Renesas Electronics Corporation, Kanagawa (JP)

(72) Inventor: Tadashi Yamaguchi, Kanagawa (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 0 days.

(21) Appl. No.: 14/326,924

(22) Filed: Jul. 9, 2014

(65) Prior Publication Data

US 2014/0319588 A1 Oct. 30, 2014

Related U.S. Application Data

(63) Continuation of application No. 13/909,310, filed on Jun. 4, 2013, now Pat. No. 8,779,482.

(30) Foreign Application Priority Data

Jun. 26, 2012 (JP) ................. 2012-142683

(51) Int. Cl.
 *H01L 27/146* (2006.01)
 *H01L 23/26* (2006.01)
 *H01L 31/0352* (2006.01)

(52) U.S. Cl.
 CPC .......... *H01L 27/14643* (2013.01); *H01L 23/26* (2013.01); *H01L 27/1463* (2013.01); *H01L 27/14698* (2013.01); *H01L 31/0352* (2013.01); *H01L 2924/0002* (2013.01)

(58) Field of Classification Search
 None
 See application file for complete search history.

(56) References Cited

U.S. PATENT DOCUMENTS

| | | | |
|---|---|---|---|
| 6,344,092 B1 * | 2/2002 | Takizawa | 148/33 |
| 6,350,663 B1 | 2/2002 | Kopley et al. | |
| 6,746,939 B2 | 6/2004 | Shimozono et al. | |
| 7,413,944 B2 | 8/2008 | Lee | |
| 7,728,277 B2 | 6/2010 | Stevens et al. | |
| 2003/0170928 A1 | 9/2003 | Shimozono et al. | |
| 2005/0179072 A1 | 8/2005 | Rhodes | |
| 2007/0063235 A1 | 3/2007 | Lee | |
| 2007/0296004 A1 | 12/2007 | Mouli | |
| 2009/0035888 A1 * | 2/2009 | Lavine et al. | 438/59 |
| 2009/0286348 A1 | 11/2009 | Mouli | |
| 2010/0214457 A1 * | 8/2010 | Sakai | 348/294 |
| 2010/0264464 A1 * | 10/2010 | Lee | 257/229 |
| 2011/0242390 A1 | 10/2011 | Sogoh et al. | |
| 2011/0249163 A1 * | 10/2011 | Ikeda et al. | 348/308 |
| 2011/0306193 A1 * | 12/2011 | Krull et al. | 438/515 |

FOREIGN PATENT DOCUMENTS

| | | |
|---|---|---|
| JP | 2002-353434 | 12/2002 |
| JP | 2007-088406 | 4/2007 |
| JP | 2007-165450 | 6/2007 |

* cited by examiner

*Primary Examiner* — Joseph Schoenholtz
(74) *Attorney, Agent, or Firm* — Young & Thompson

(57) ABSTRACT

Provided is a semiconductor device having good properties. Particularly, the semiconductor device is provided which can improve imaging properties. The semiconductor device (CMOS image sensor) includes a plurality of pixels, each having a photodiode PD for generating a charge by receiving light, and a transfer transistor TX for transferring the charge generated by the photodiode PD. The semiconductor device further includes an active region AcTP with the photodiode, and an active region AcG located on an upper side of the region AcTP in the planar direction and having a contact Pg to which a ground potential is applied. A gettering region GET is disposed in the active region AcG.

8 Claims, 40 Drawing Sheets

SEMICONDUCTOR DEVICE

CROSS-REFERENCE TO RELATED APPLICATIONS

The disclosure of Japanese Patent Application No. 2012-142683 filed on Jun. 26, 2012 including the specification, drawings and abstract is incorporated herein by reference in its entirety.

BACKGROUND

The present invention relates to semiconductor devices, and more specifically, a technique that can be applied to a semiconductor device including a solid-state image sensor.

Solid-state image sensors using a complementary metal oxide semiconductor (CMOS) have been developed as one of solid-state image sensors. The CMOS image sensor includes a plurality of pixels having a photodiode and a transfer transistor.

For example, Patent Document 1 (Japanese Unexamined Patent Publication 2007-165450) discloses a solid-state image sensor with pixels including a photoelectric conversion part for generating and storing charges according to an incident light, and a charge detection region to which the charges stored in the photoelectric conversion part are transferred. In the technique disclosed, a charge storage region of the photoelectric conversion part is formed of a first semiconductor layer of a first conductive type. An isolation region for electrically isolating one pixel from the other adjacent thereto is formed of a semiconductor layer of a second conductive type. A high-concentration second semiconductor layer of the first conductive type located in the isolation region forms a gettering layer.

Patent Document 2 (Japanese Unexamined Patent Publication 2007-88406) discloses a CMOS image sensor that can reduce leakage current by gettering metal ion contamination by implanting p-type impurity ions in a high concentration, into a dummy moat region.

Patent Document 3 (Japanese Unexamined Patent Publication 2002-353434) discloses a technique which involves forming an embedded getter sink layer by introducing carbon (c) into a semiconductor substrate, forming a crystal growth layer by growing Si crystals over the surface of a semiconductor substrate, and forming a solid-state image sensor in the crystal growth layer.

RELATED ART DOCUMENTS

Patent Documents

[Patent Document 1]
Japanese Unexamined Patent Publication No. 2007-165450
[Patent Document 2]
Japanese Unexamined Patent Publication No. 2007-88406
[Patent Document 3]
Japanese Unexamined Patent Publication No. 2002-353434

SUMMARY

The photodiode included in the CMOS image sensor is a light receiving portion, and is comprised of, for example, a p-type semiconductor region and an n-type semiconductor region. In the CMOS image sensor, a charge generated by the photoelectric conversion in the p-type semiconductor region is read as a signal by a circuit element (MOS via the n-type semiconductor region.

However, the presence of impurity metal (contaminant metals, for example, W, Mo, Fe, Co, Ni, etc.) in the p-type and n-type semiconductor regions forms an emission level due to the metal. Such an emission level is positioned between a valence band and a conduction band, and thus generates a pair of hole and electron via the emission level even when the light is not applied. The generated electrons cause dark current. Increase in dark current leads to lighting errors (white spot) based on a signal (or noise) even though the light is not applied. The light error is called a white spot in dark.

The occurrence of the white spot cannot accurately take an image of a subject, which degrades the imaging properties.

The semiconductor device with the photodiode and the MOS, such as the CMOS image sensor, is desired to take measures against metal contamination. Such measures against the metal contamination include a poly back seal technique which involves forming a polysilicon layer as a gettering layer over a back side of a Si substrate, and a bulk micro defect (BMD) technique which involves doping carbon (c) as a gettering layer and forming an epitaxial layer for element formation. Such techniques, however, are not enough as the measures against the metal contamination.

As the load of the heat treatment is reduced with decreasing size of the MOS, the diffusion length of a metal element to be trapped in the surface of the MOS becomes small, which cannot sufficiently exhibit the effects through the above poly back seal technique or BMD technique.

It is desired to study a semiconductor device (CMOS image sensor) that can effectively take the measures against the metal contamination, specifically, gettering even when the diffusion length of a metal element to be trapped into the surface of the MOS becomes smaller together with the miniaturization of the MOS.

Other problems and new features of the invention will be better understood after a reading of the following detailed description in connection with the accompanying drawings wherein:

The outline of the representative embodiments of the invention disclosed in the present application will be briefly described as follows.

According to the representative embodiment of the invention disclosed in the present application, a semiconductor device includes a first active region and a second active region formed at a first main surface of a semiconductor substrate, and respectively surrounded by an element isolation region made of an insulator in the plan view. The semiconductor device also includes a photodiode formed in the first active region, and a gate electrode for a transfer transistor for transferring a charge generated by the photodiode, the gate electrode being formed in the first active region, and disposed adjacent to the photodiode in the plan view. The semiconductor device further includes a contact which is coupled to the second active region and to which a ground potential is applied, and a gettering region formed at the first main surface of the second active region.

The semiconductor device according to the following representative embodiments disclosed in the present application can improve the properties or characteristics of the semiconductor device.

DETAILED DESCRIPTION

Figure 1:
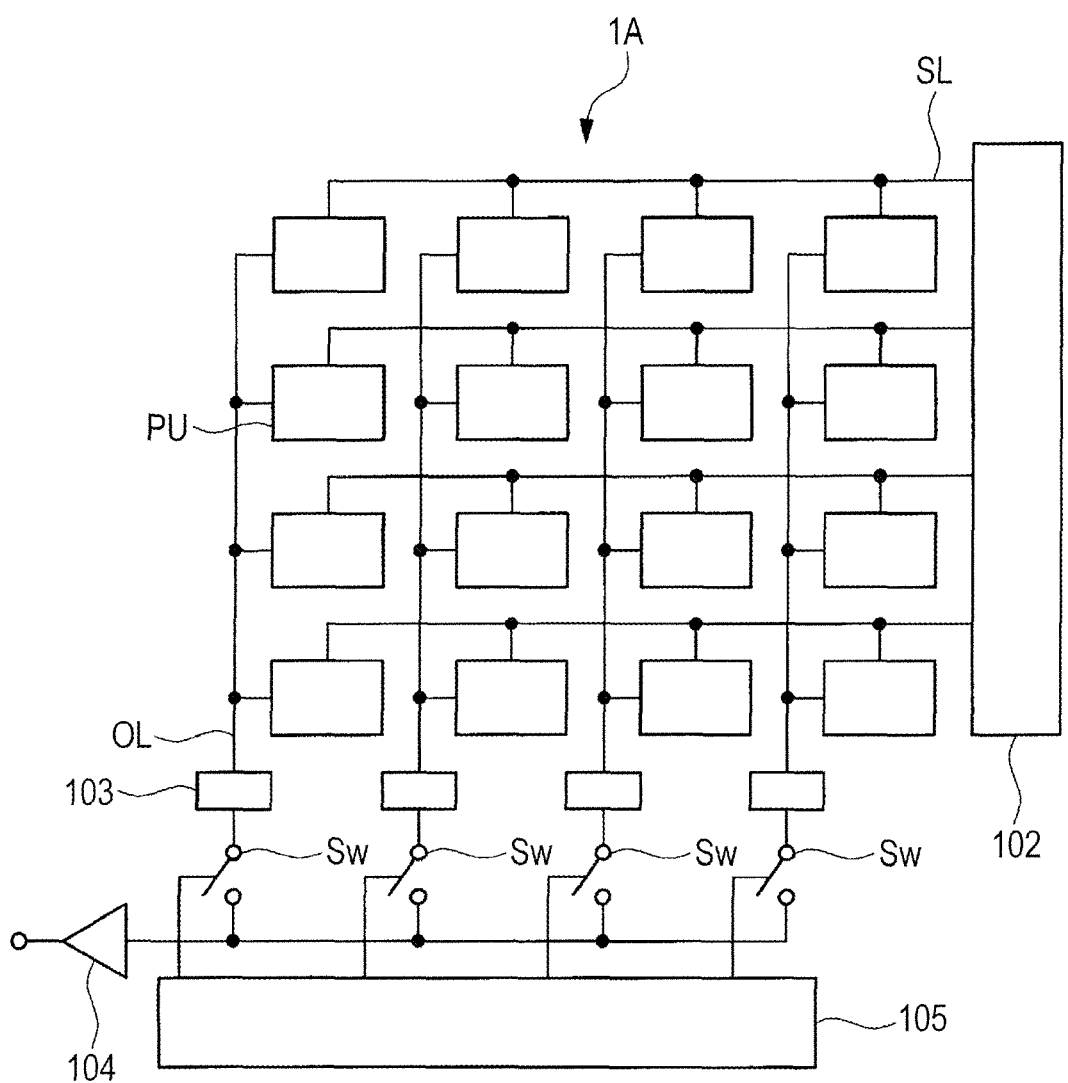
FIG. 1 is a circuit block diagram showing an example of a semiconductor device structure according to a first embodiment of the invention.

The following preferred embodiments of the invention may be described below by being divided into a plurality of sections or embodiments for convenience, if necessary, which are not independent from each other unless otherwise specified. One of the sections or embodiments may be a modified example, an application example, a detailed description, or supplementary explanation of a part or all of the other. Even when referring to a specific number about an element and the like (including the number of elements, a numerical value, an amount, a range, and the like) in the following embodiments, the invention is not limited to the specific number, and may take the number greater than, or less than the specific numeral number, unless otherwise specified, and except when limited to the specific number in principle.

The components (including steps) in the following embodiments are not necessarily essential unless otherwise specified, and except when clearly considered to be essential in principle. Likewise, when referring to the shape of one component, or the positional relationship between the components in the following embodiments, any shape or positional relationship substantially similar or approximate to that described herein may be included in the invention unless otherwise specified and except when clearly considered not to be so in principle. The same goes for the above number (the number of elements, the numerical value, the amount, the range, and the like).

Now, the preferred embodiments of the invention will be described in detail below with reference to the accompanying drawing. In each drawing for explaining the embodiments, the same or like parts having the same function are indicated by the same or similar reference characters, and its description will not be repeated in principle.

When a plurality of similar parts (portions) exists, another reference character is added to an original generic designation to indicate an individual or specific portion in some cases. In the embodiments below, the description of the same or like parts will not be repeated in principle if not necessary.

In the accompanying drawings used in the embodiments, even some cross-sectional views may omit hatching for easy understanding. On the other hand, even some plan views may be designated by hatching for easy understanding.

The size of each part shown in the cross-sectional view and plan view does not reflect the real relative size of an actual device. For easy understanding, some parts are shown in a relatively larger size as compared to the real relative size. Even when the plan view corresponds to the cross-sectional view, the same part is often shown to have a different size in each view.

First Embodiment

The structure and manufacturing method of a semiconductor device (CMOS image sensor) according to this embodiment will be described in detail below with reference to the accompanying drawings.

Explanation of Structure.

Figure 2:
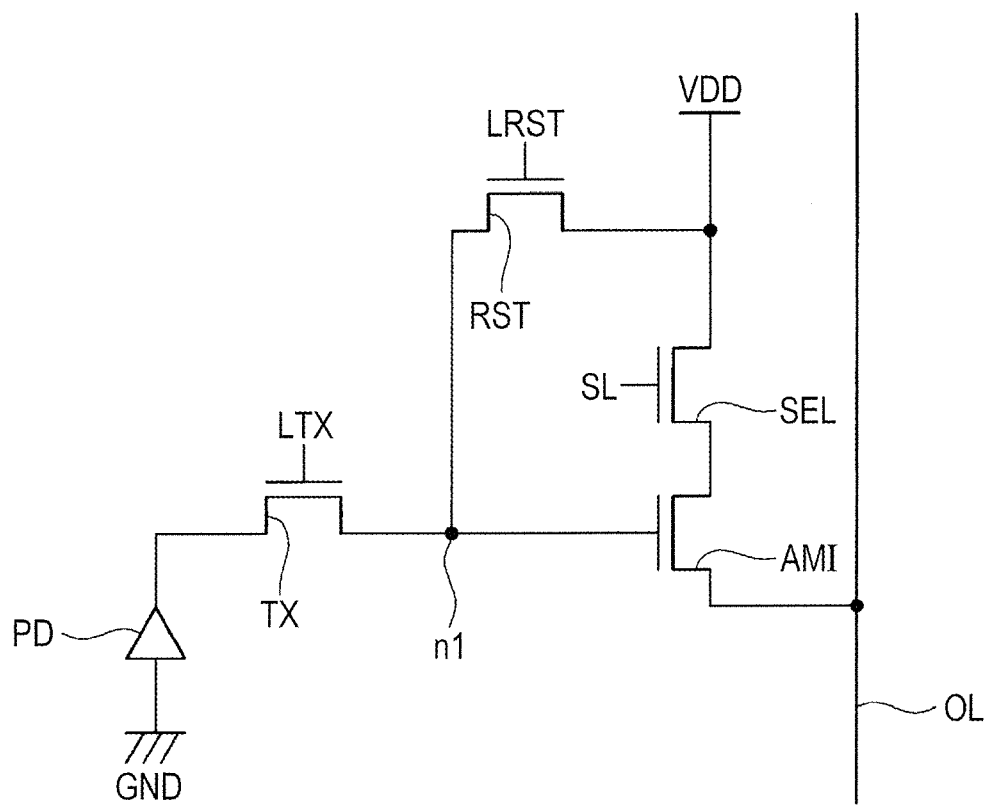
FIG. 2 is a circuit diagram showing an example of the structure of a pixel.

FIG. 1 shows a circuit block diagram of an example of a semiconductor device structure in this embodiment. FIG. 2 shows a circuit diagram of an example of the structure of a pixel. FIG. 1 shows 16 pixels arranged in an array (matrix) of 4 rows and 4 columns (4×4). However, actually, the number of pixels used in an electronic device, such as a camera, is several hundred millions.

In a pixel region 1A shown in FIG. 1, the pixels are arranged in an array. Around the region, driving circuits, including a vertical scanning circuit 102 and a horizontal scanning circuit 105 are arranged. Each pixel (cell, pixel unit) PU is positioned at an intersection between a selection line SL and an output line OL. The selection line SL is coupled to the vertical scanning circuit 102, and the output line OL is coupled to a column circuit 103. The column circuit 103 is coupled to an output amplifier 104 via a switch SW. Each switch Sw is coupled to the horizontal scanning circuit 105, and controlled by the horizontal scanning circuit 105.

For example, an electric signal read from the pixel PU selected by the vertical scanning circuit 102 and the horizontal scanning circuit 105 is output via the output line OL and the output amplifier 104.

As shown in FIG. 2, for example, the pixel PU includes a photodiode PD, and four MOSFET (RST, TX, SEL, AMI). These MOSFETs are of an n-channel type. RST is a reset transistor, TX is a transfer transistor, SEL is a selection transistor, and AMI is an amplifier transistor. Other transistors or capacity elements may be incorporated in addition to the above transistors. Connection forms of the transistors include various modifications and applications. A MOSFET is an abbreviation for "MOS semiconductor field effect transistor", and can also be referred to as a "MISFET ("metal insulator semiconductor field effect transistor")".

In the example of the circuit shown in FIG. 2, the photodiode PD and the transfer transistor TX are coupled in series between a ground potential (GND) and a node n1. The reset transistor RST is coupled to between the node n1 and a power supply potential (VDD, power supply potential line LVDD). The selection transistor SEL and the amplifier transistor AMI are coupled in series to between the power supply potential (VDD) and the output line OL. A gate electrode of the amplifier transistor AMI is coupled to the node n1. A gate electrode of the reset transistor RST is coupled to a reset line LRST. A gate electrode of the selection transistor SEL is coupled to the selection line SL. A gate electrode of the transfer transistor TX is coupled to a transfer line (second selection line) LTX.

For example, the transfer line LTX and the reset line LRST are turned up (to an H level) to turn on the transfer transistor TX and the reset transistor RST. As a result, all charges are pulled out of the photodiode PD, which is depleted. Then, the transfer transistor TX is turned off.

Thereafter, for example, after opening a mechanical shutter of the electronic device, such as a camera, the photodiode PD generates a charge from the incident light and stores the charge therein while the shutter is opened.

Next, after closing the shutter, the reset line LRST is turned down (to a L level) to turn off the reset transistor RST. Further, the selection line SL and the transfer line LTX are turning up (to an H level) to turn on the selection transistor SEL and the transfer transistor TX. Thus, the charge of the photodiode PD is transferred to an end of the node n1 of the transfer transistor TX (floating diffusion FD). That is, the potential of the floating diffusion FD changes according to the charge transferred from the photodiode PD. The charge is amplified by the amplifier transistor AMI, and represented on the output line OL. The potential of the output line OL is converted to an electric signal (light receiving signal), which is read as an output signal from the output amplifier 104 via the column circuit 103 and the switch Sw.

Figure 3:
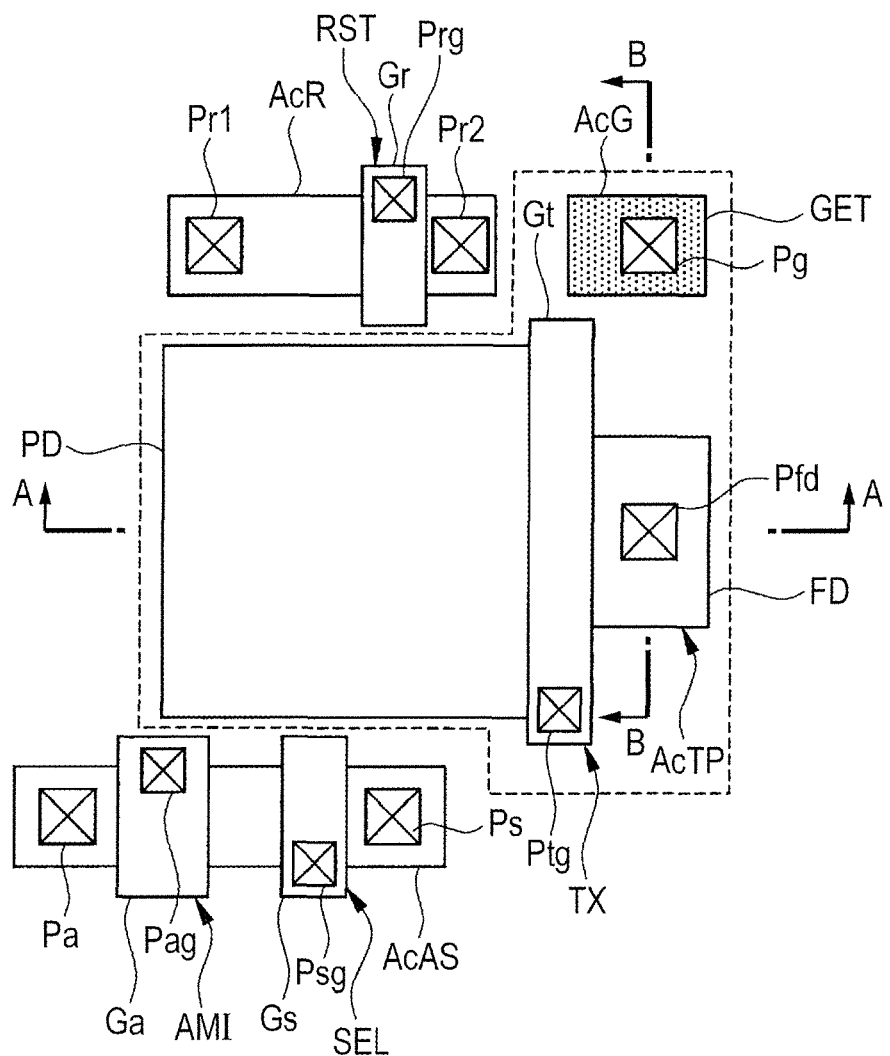
FIG. 3 is a plan view showing the pixel of the semiconductor device in the first embodiment.

FIG. 3 shows a plan view of the pixel of the semiconductor device in this embodiment. The specific structure of the semiconductor device in this embodiment is surrounded by a broken line of FIG. 3. That is, the semiconductor device of this embodiment includes an active region AcTP in which the photodiode PD and the transfer transistor TX are disposed, and an active region AcG in which a gettering region GET is disposed. A contact (contact plug, plug, or coupling portion) Pg coupled to a ground potential line (LGND) is disposed over the active region AcG.

In this way, with the above structure, the gettering region GET is provided in the surface of the AcG, and can trap therein contaminant metals (for example, W, Mo, Fe, Co, Ni, and the like). An electron (e) of the contaminant metal can be released via the contact Pg coupled to the ground potential GND. Thus, dark current or white spot in dark due to the contaminant metals can be reduced to thereby improve the imaging properties. A feeder region (active region AcG, and the gettering region GET) is surrounded by an element isolation region made of an insulator in a plan view, which can effectively release the electrons (e) from the contaminant metals as compared to the case of PN junction isolation.

Referring to FIG. 3, the structure of the semiconductor device in this embodiment will be specifically described below. As shown in FIG. 3, the pixel PU of the semiconductor device in this embodiment includes an active region AcTP in which the photodiode PD and the transfer transistor TX are disposed, and the active region AcR in which the reset transistor RST is disposed. The pixel PU further includes an active region AcAS in which the selection transistor SEL and the amplifier transistor AM1 are disposed, and an active region AcG in which the contact (contact plug, plug, coupling portion) Pg coupled to the ground potential line LGND is disposed.

In the active region AcR, the gate electrode Gr is disposed, and contacts Pr1 and Pr2 are disposed in source and drain regions positioned on both sides of the gate electrode. The source and drain regions and the gate electrode Gr form the reset transistor RST.

In the active region AcTP, a gate electrode Gt is disposed. The photodiode PD is disposed on one of both sides of the gate electrode Gt, and a floating diffusion (charge storage portion, floating diffusion layer) FD is disposed on the other side. The photodiode PD is a pn junction diode, and comprised of, for example, a plurality of n-type or p-type impurity regions (semiconductor regions). The floating diffusion FD is comprised of, for example, an n-type impurity region. A contact Pfd is disposed over the floating diffusion FD.

A gate electrode Ga and a gate electrode Gs are disposed in the active region AcAS. A contact Pa is disposed at the end of the active region on the gate electrode Ga side, and a contact Ps is disposed at the other end of the active region on the gate electrode Gs. On both sides of each of the gate electrodes (Ga, Gs), the source and drain regions are positioned. The selection transistor SEL and the amplifier transistor AMI are coupled together in series by the gate electrodes (Ga, Gs) and the source and drain regions.

In the active region AcG is disposed the gettering region GET, over which the contact Pg is disposed. The gettering region GET is a region formed by implanting impurities for gettering, such as carbon (C) or boron (B). Such implantation of the impurities causes crystal defects or distortion in the semiconductor substrate. The crystal defects or distortion (which serves as a gettering site) can trap and fix the contaminant metals therein. In this way, the term "gettering region" as used herein means a region (layer) with the gettering site formed therein. The contact Pg is coupled to the ground potential line (LGND). The active region AcG serves as a feeder region for applying a ground potential GND to the semiconductor substrate (well region).

Figure 4:
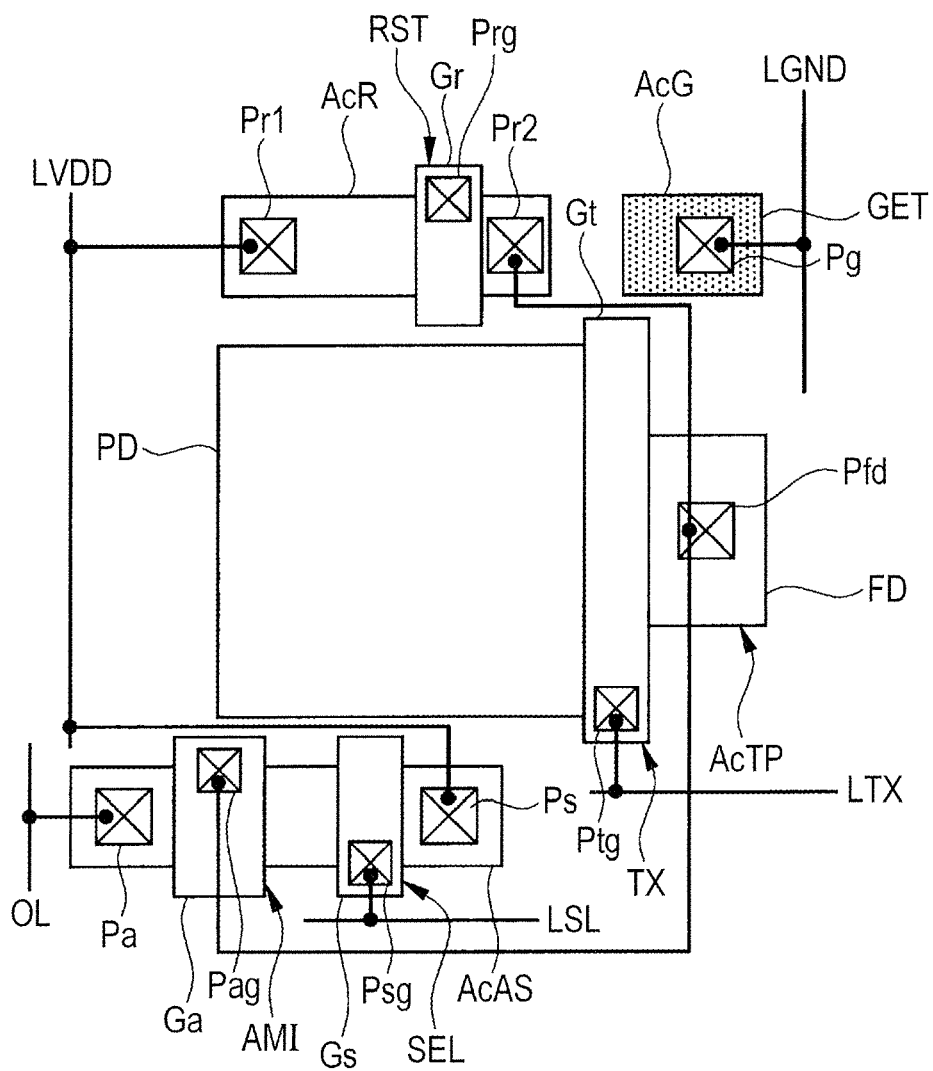
FIG. 4 is a diagram showing one example of connection of respective contacts.

The contacts (Pr1, Pr2, Pg, Pfd, Pa, Ps) and the contacts (Prg, Ptg, Pag, Psg) formed over the gate electrodes (Gr, Gt, Ga, Gs) can be coupled to a plurality of wiring layers (for example, first wiring layer M1 to third wiring layer M3) to form the circuit shown in FIGS. 1 and 2. FIG. 4 shows one example of connection of the respective contacts.

Figure 5:
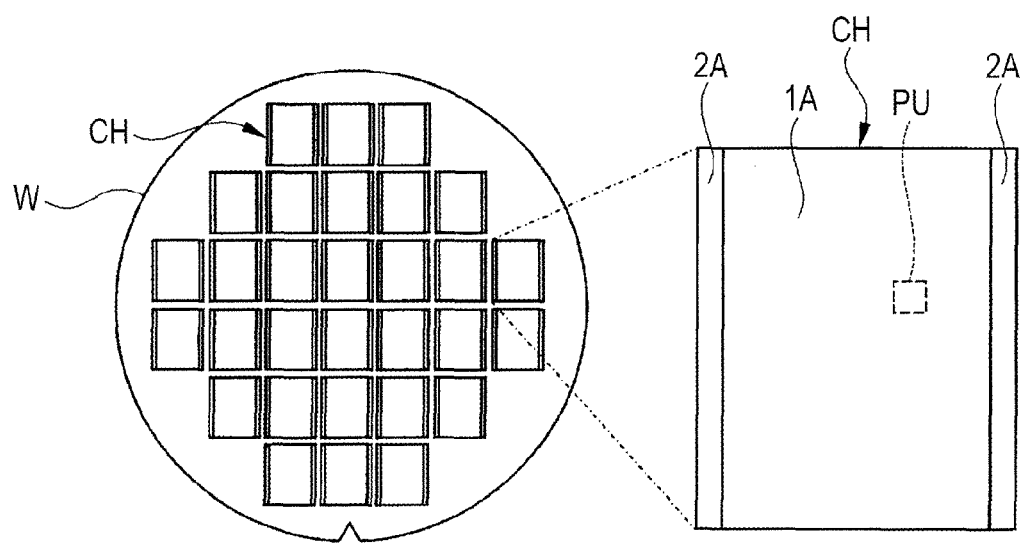
FIG. 5 is a plan view showing a semiconductor wafer and chip regions with the semiconductor device in the first embodiment.

FIG. 5 shows a plan view of a semiconductor wafer and chip regions over which the semiconductor of this embodiment is formed. As shown in FIG. 5, the semiconductor wafer W includes a plurality of chip regions CH. The pixel region 1A shown in FIG. 1 is formed in one chip region CH, together with the peripheral circuit region 2A. In the peripheral circuit region 2A, a logical circuit (logic circuit) is disposed. The logical circuit computes an output signal to be output from the pixel region 1A, and based on the result of the computation, an image data is output.

Figure 6:
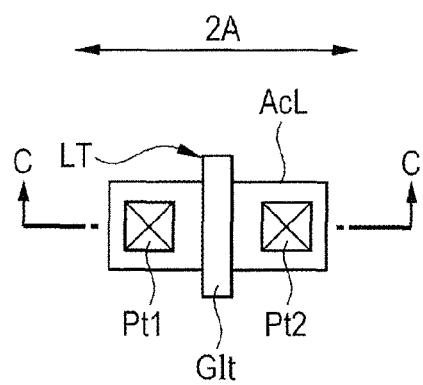
FIG. 6 is a plan view showing a transistor formed in a peripheral circuit region of the semiconductor device in the first embodiment.
Figure 7:
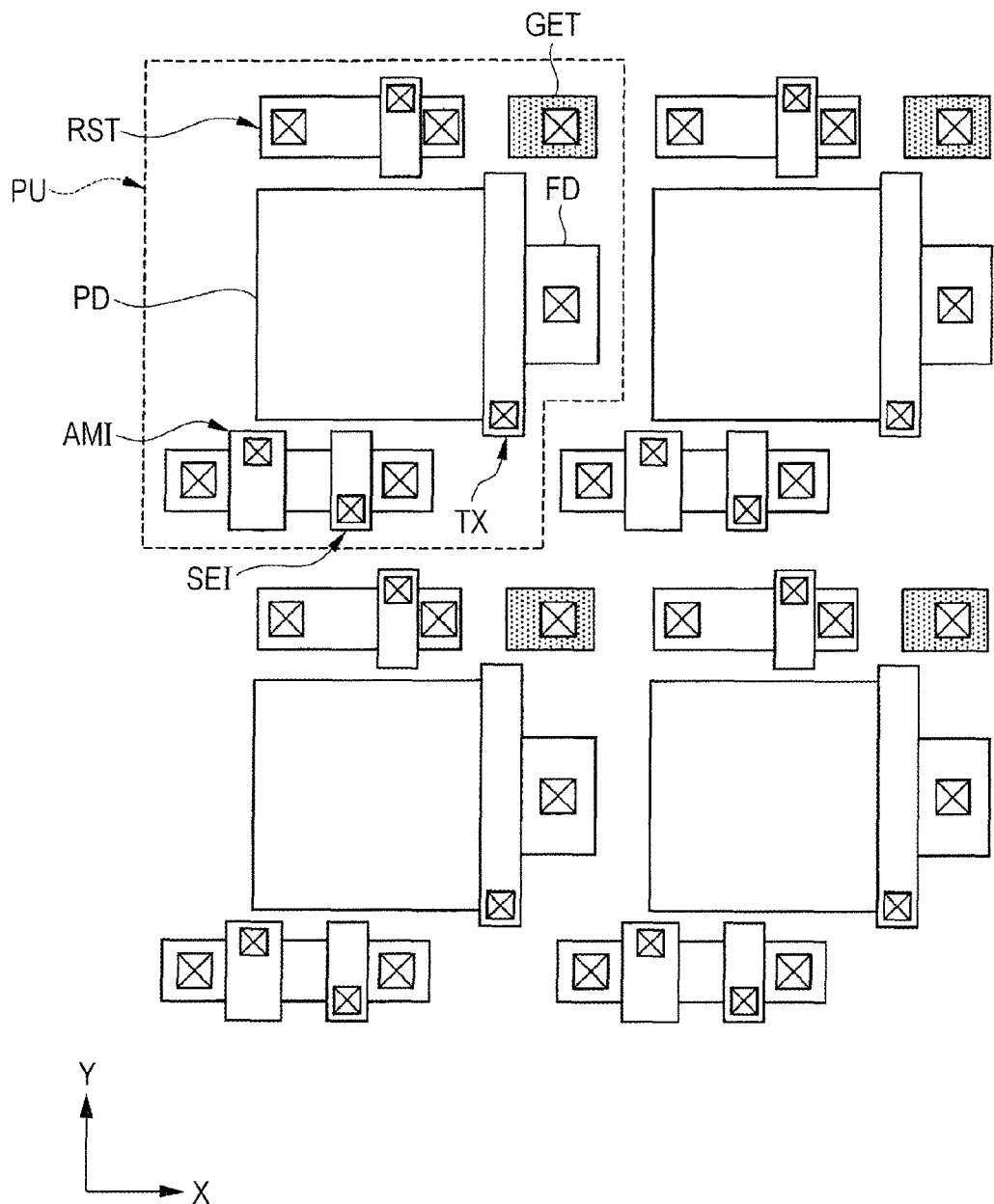
FIG. 7 is a plan view showing a plurality of pixels formed in a pixel region of the semiconductor device in the first embodiment.

FIG. 6 shows a plan view of the transistor formed in the peripheral circuit region of the semiconductor device in this embodiment. FIG. 7 shows a plan view of a plurality of pixels formed in the pixel region of the semiconductor device in this embodiment.

As shown in FIG. 6, a transistor (logic transistor) LT is disposed in the peripheral circuit region 2A. The transistors LT include an N-type MOSFET (NMOSFET) using electrons as a carrier, and a P-type MOSFET using holes as a carrier. FIG. 6 shows one transistor forming the logic circuit, for example, NMOSFET. The gate electrode Glt is disposed in the active region AcL, and the contacts Pt1 and Pt2 are disposed over the source and drain regions on both sides of the gate electrode. FIG. 6 shows only one transistor LT, but in the peripheral circuit region 2A, a plurality of transistors are disposed. The contacts over the source and drain regions of the transistors, or the contacts over the gate electrodes can be coupled together by the wiring layers (for example, the first wiring layer M1 to third wiring layer M3) to form the logical circuit. Elements other than the transistor, for example, a capacity element or a transistor with another structure, can be incorporated in the logical circuit in some cases.

As shown in FIG. 7, the pixels PU shown in FIG. 3 are arranged in the pixel region in the directions X and Y to form a pixel array. FIG. 7 illustrates the pixels PU arranged in 2×2.

Figure 8:
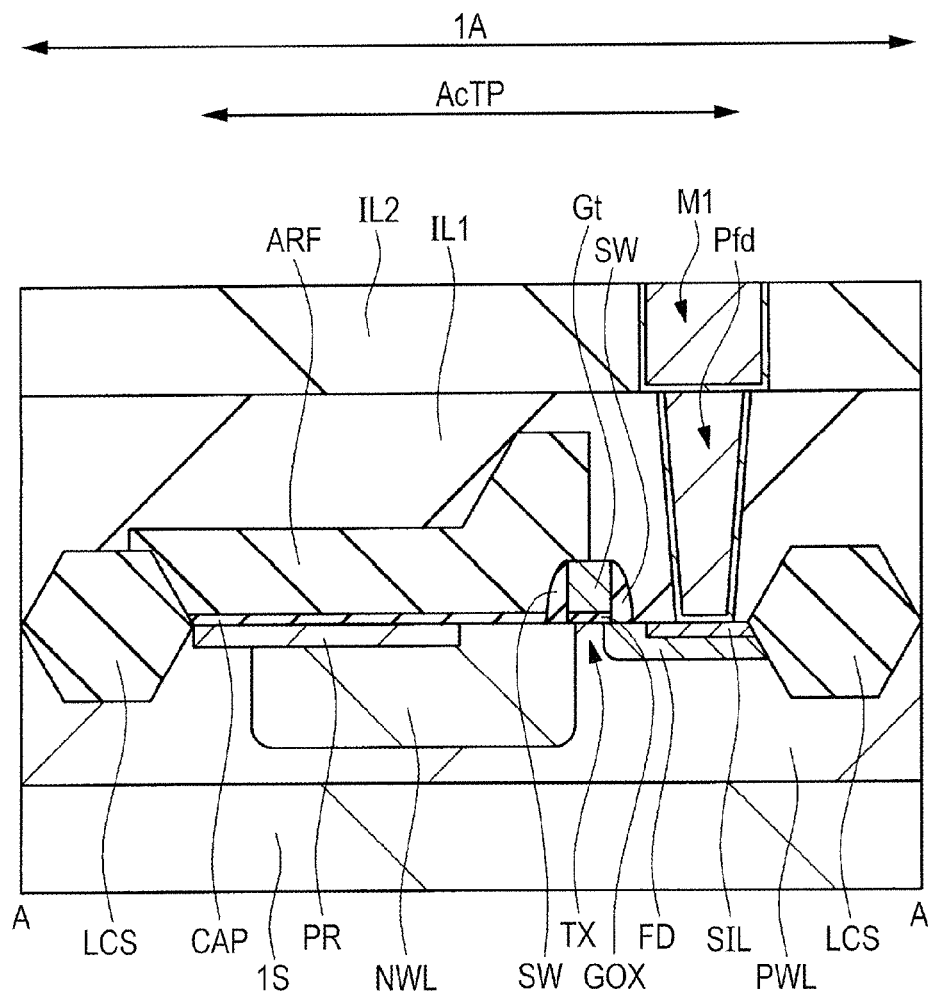
FIG. 8 is a cross-sectional view taken along the line A-A of FIG. 3, showing the semiconductor device structure in the first embodiment.
Figure 9:
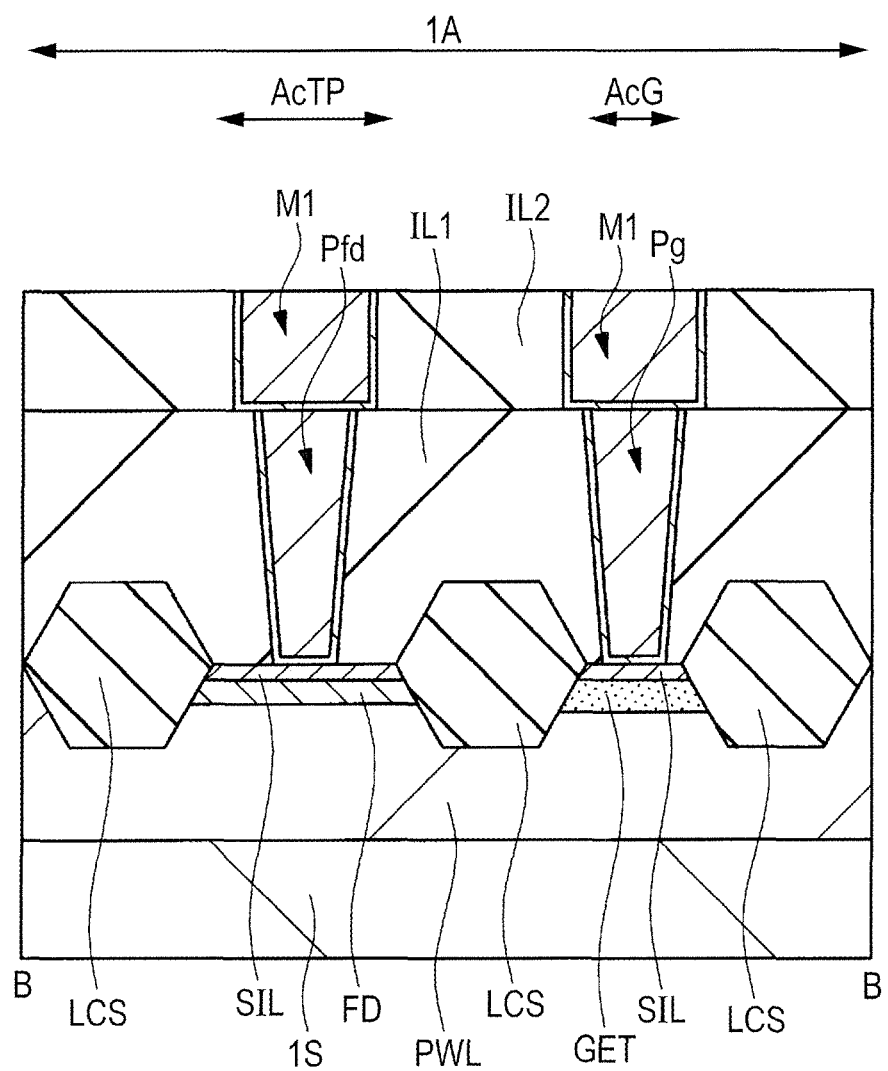
FIG. 9 is a cross-sectional view taken along the line B-B of FIG. 3, showing the semiconductor device structure in the first embodiment.
Figure 10:
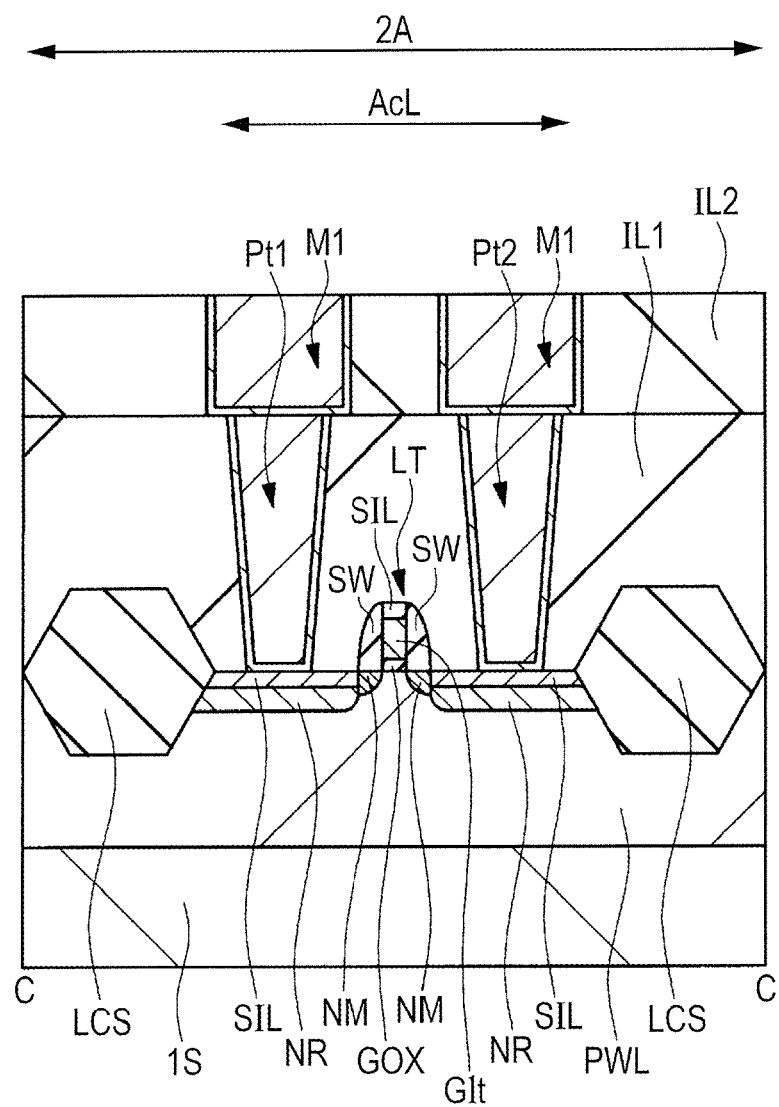
FIG. 10 is a cross-sectional view taken along the line C-C of FIG. 6, showing the semiconductor device structure in the first embodiment.

Next, the semiconductor device structure in this embodiment will be described below with reference to the accompanying cross-sectional views. FIGS. 8 to 10 are cross-sectional views showing the semiconductor device structure in this embodiment. FIG. 8 corresponds to the cross-sectional view taken along the line A-A of FIG. 3. FIG. 9 corresponds to the cross-sectional view taken along the line B-B of FIG. 3. FIG. 10 corresponds to the cross-sectional view taken along the line C-C of FIG. 6.

As shown in FIGS. 8 and 9, the photodiodes (p-type well PWL and n-type well NWL, PD) and the transfer transistor TX are formed in the active region AcTP of the pixel region 1A of the semiconductor substrate 1S. A gettering region GET is formed over the surface (upper surface, upper portion) of the active region AcG (see FIG. 9). As shown in FIG. 10, a transistor LTT is formed in the active region AcL of the peripheral circuit region 2A of the semiconductor substrate 1S.

The semiconductor substrate 1S is made of a single-crystal silicon containing n-type impurities (donors), such as phosphorus (P) or arsenic (As). An element isolation region LCS is disposed at the outer periphery of the active region AcTP. In this way, exposed regions of the semiconductor substrate 1S surrounded by the element isolation region LCS become active regions (AcTP, AcG, AcL, and the like).

In each active region (AcTP, AcG, AcL, or the like), p-type impurities, such as boron (B), are introduced to form a p-type well PWL.

The n-type well NWL is formed by introducing n-type impurities, such as phosphorus (P) or arsenic (As), into the active region AcTP so as to be positioned within the p-type well PWL. The p-type well PWL ($p^-$-type semiconductor region) and the n-type well NWL ($n^-$-type semiconductor region) form the photodiode (pn junction diode, PD).

A $p^+$-type semiconductor region PR is formed over a part of the surface of the n-type well NWL. The $p^+$-type semiconductor region PR is formed for the purpose of suppressing generation of electrons due to the interface levels formed over the surface of the semiconductor substrate 1S. That is, in some superficial regions of the semiconductor substrate 1S, electrons might be generated by the influence of the interface level even without radiation of light to induce the increase in dark current. Thus, the $p^+$-type semiconductor region PR using holes as the carrier is formed over the n-type well NWL using electrons as the carrier, which can suppress the generation of electrons without radiation of the light to thereby suppress the increase in dark current.

The gate electrode Gt is formed so as to be superimposed over a part of the n-type well NWL in a planar manner. The gate electrode Gt is disposed over the semiconductor substrate 1S via a gate insulating film GOX. The gate electrode Gt has sidewalls (sidewall films) SW formed on both side walls thereof.

On one side of the gate electrode Gt (opposite to the photodiode PD), a floating diffusion FD is formed of an $n^+$-type semiconductor region by introducing n-type impurities, such as phosphorus (P) or arsenic (As).

In the way above, the photodiode (PD) and the transfer transistor TX are formed over the semiconductor substrate 1S. Specifically, the photodiode (PD) is formed of the p-type well PWL and the n-type well NWL, and the transfer transistor TX uses the n-type well NWL as a source region, and the floating diffusion FD as a drain region. A region sandwiched between the source region and the drain region is a channel formation region, and the gate electrode Gt is formed over the channel formation region via the gate insulating film GOX. A silicide film SIL is formed over the floating diffusion FD.

A cap insulating film CAP is formed over the surface of the photodiode (PD) (surface of the n-type well NWL and the $p^+$-type semiconductor region PR). The cap insulating film CAP is formed to keep the surface properties (interface properties) of the semiconductor substrate 1S good. A reflection preventing film ARF is formed over the cap insulating film CAP.

The gettering region GET is formed over the surface (upper surface, upper portion) of the active region AcG (see FIG. 9).

The p-type well PWL is formed under the gettering region GET. A ground potential (GND) is applied to the p-type well PWL via the contact Pg.

The silicide film SIL is formed over the gettering region GET. In other words, the gettering region GET is formed under the silicide film SIL in the active region AcG. In contrast, the gettering region GET is not formed under the silicide film SIL of the floating diffusion FD (see FIG. 9).

The gate electrode G1t is formed over the p-type well PWL in the active region AcL via the gate insulating film GOX (see FIG. 10). The source and drain regions are formed in the p-type well PWL located on both sides of the gate electrode G1t. The source and drain regions have a lightly doped drain (LDD) structure, and is formed of an n-type low-concentration semiconductor region ($n^-$-semiconductor region) NM, and an n-type high-concentration semiconductor region ($n^+$-type semiconductor region) NR. A silicide film S1L is formed over the surface of the n-type high-concentration semiconductor region NR.

An interlayer insulating film IL1 is formed over the reflection preventing film ARF, the transfer transistor TX, the gettering region GET, and the transistor LT. The contacts (Pfd, Pg, Pt1, Pt2, and the like) made of a conductive film are located in the interlayer insulating film IL1. The contact Pfd is formed over the floating diffusion FD, and the contact Pg is formed over the gettering region GET. The contacts Pt1 and Pt2 are formed over the source and drain regions (high-concentration semiconductor regions NR) of the transistor LT.

An interlayer insulating film IL2 is formed over the interlayer insulating film IL1. A first wiring layer M1 is formed over the contacts (Pfd, Pg, Pt1, Pt2). Over the first wiring layer M1, an interlayer insulating film and a wiring are laminated (see FIGS. 38 to 40).

Contacts not shown in FIGS. 8 to 10 are formed in the interlayer insulating film IL1. FIGS. 8 to 10 do not show the cross sections of the reset transistor RST, the selection transistor SEL, and the amplifier transistor AMI. However, these transistors include a gate electrode formed over the p-type well PWL via a gate insulating film, and source and drain regions formed in the p-type well PWL located on both sides of the gate electrode. The selection transistor SEL and the amplifier transistor AMI are coupled in series, and shares one of the source and drain regions therebetween (see FIG. 3).

Description of Manufacturing Method

Next, a manufacturing method of the semiconductor device in this embodiment will be described below with reference to FIGS. 11 to 40, and the structure of the semiconductor device will be clarified in more detail. FIGS. 11 to 40 are cross-sectional views showing manufacturing steps of the semiconductor device in this embodiment. Each cross-sectional view corresponds to the cross-sectional view taken along the line A-A of FIG. 3, the line B-B of FIG. 3, or the line C-C of FIG. 6.

Figure 11:
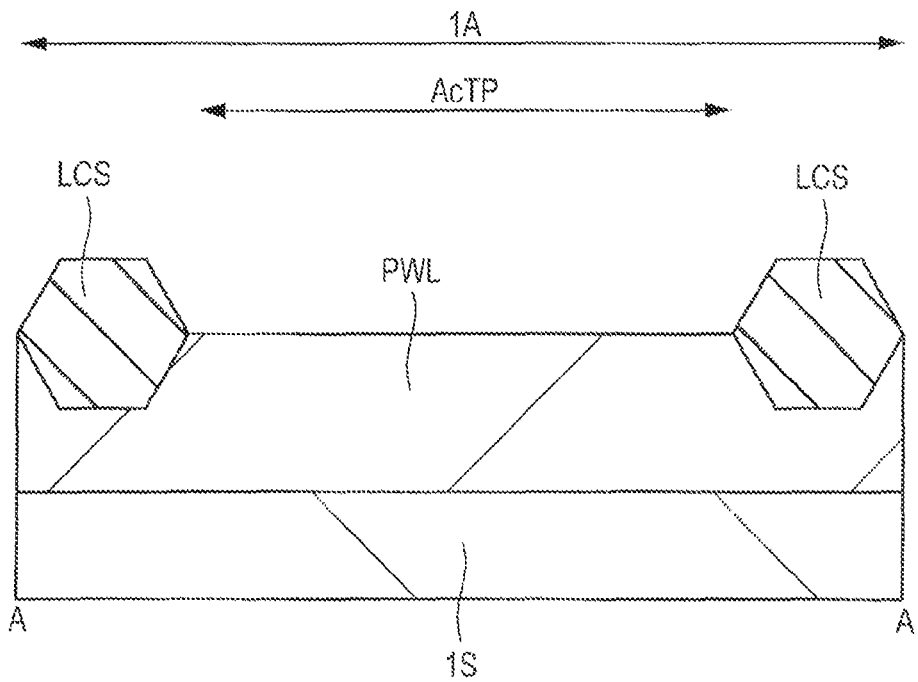
FIG. 11 is a cross-sectional view taken along the line A-A of FIG. 3, showing a manufacturing step of the semiconductor device in the first embodiment.
Figure 12:
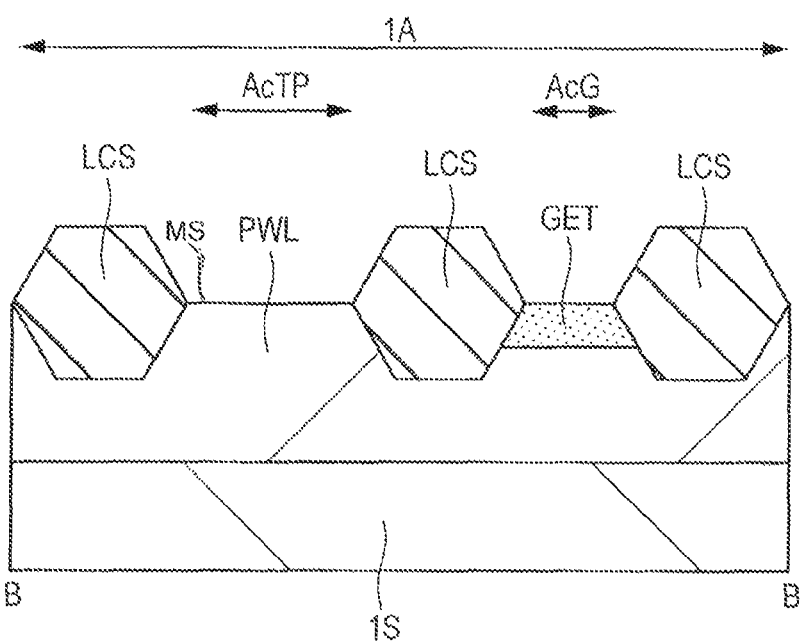
FIG. 12 is a cross-sectional view taken along the line B-B of FIG. 3, showing the manufacturing step of the semiconductor device in the first embodiment.
Figure 13:
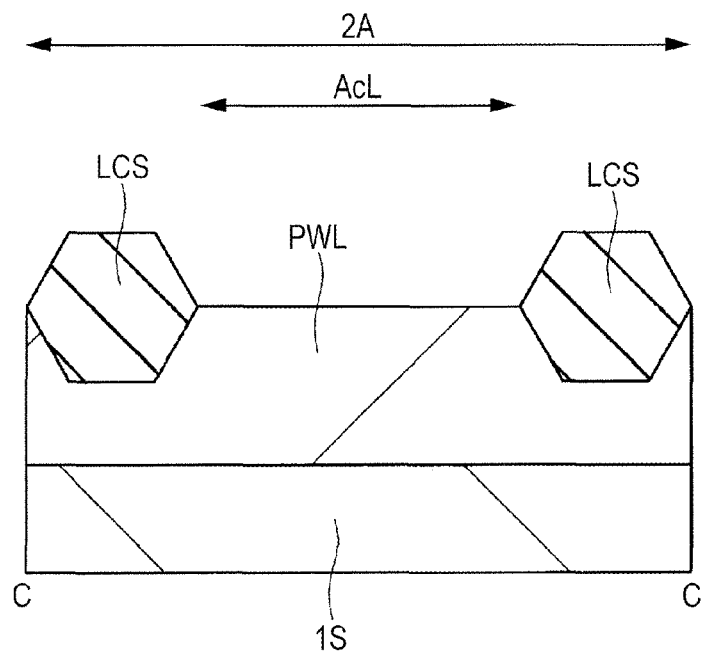
FIG. 13 is a cross-sectional view taken along the line C-C of FIG. 6, showing the manufacturing step of the semiconductor device in the first embodiment.

As shown in FIGS. 11 to 13, a single-crystal silicon substrate containing n-type impurities, such as phosphorus (P) or arsenic (As), is prepared as the semiconductor substrate 1S.

Then, element isolation regions LCS are formed in the semiconductor substrate 1S. The element isolation region LCS is formed of a thermal oxide film. For example, the regions to serve as the active regions (AcTP, AcG, AcL, or the like) of the semiconductor substrate 1S are covered with a silicon nitride film, and subjected to thermal oxidation to thereby form the element isolation regions LCS made of an insulating material, such as a silicon oxide film or the like. Such a method of element isolation is called the "local oxidation of silicon (LOCOS) method". The element isolation regions LCS partition the semiconductor substrate into the respective active regions (AcTP, AcG, AcL, and the like).

The element isolation region may be formed using a shallow trench isolation (STI) method, instead of the LOCOS method (see, for example, FIG. 44). In this case, the element isolation region is formed of an insulating material embedded in a trench of the semiconductor substrate 1S. An isolation trench is formed by etching the semiconductor substrate 1S using the above silicon nitride film as a mask. Then, an insulating film, such as a silicon oxide film, is embedded in the isolation trench to thereby form the element isolation regions (trench isolation ST1).

Next, p-type impurities, such as boron (B), are introduced into the semiconductor substrate 1S (active regions (AcTP, AcG, ACL, and the like)) by using photolithography and ion implantation to thereby form the p-type well PWL. The p-type well PWL under the active film AcG extends up to the bottom of the active region AcTP under the element isolation regions LCS.

Then, impurities for gettering are introduced into the surface of the active region AcG by using photolithography and ion implantation to form the gettering region GET (see FIG. 12). The gettering region GET (depth of introduction of the impurities for gettering) is preferably shallower than the n-type well (NWL) forming the photodiode (pn junction diode, PD). The depth of the gettering region GET (depth of introduction of the impurities for gettering, or distance from the surface of the active region to the bottom thereof) is preferably 100 nm or less.

In the above range of the depth, the impurities for gettering can be easily implanted, and the gettering region GET can be disposed in the relatively superficial part of the active region AcG. Thus, even when the process progresses at a low temperature to decrease the diffusion length of the contaminant metals, the gettering effect can also be effectively exhibited.

The impurities for gettering to be introduced are carbon (C) or a carbon compound. Carbon (c) or carbon compounds are introduced, for example, by ion implanting carbon cluster ($C_{16}H_x^+$, $C_7H_x^+$). In this case, carbon clusters ($C_7H_x^+$) are ion implanted at an energy of 10 keV in a concentration of $5 \times 10^{15}/cm^2$. Then, heat treatment (annealing) is applied to the substrate.

The region into which the impurities for gettering are implanted is amorphous, and subjected to the heat treatment, so that the region is recrystallized. In the recrystallization, distortion occurs in the region due to the introduced carbon elements to form defects in the region. The defects (gettering site) in the thus-formed region containing carbon trap the contaminant metals therein to exhibit the gettering function. The carbon content of the region containing carbon (gettering region) is, for example, $1 \times 10^{19}/cm^3$ or more but $1 \times 10^{21}/cm^3$ or less. The atomic percentage of carbon replaced by a Si crystal lattice is, for example, 0.1% or more but 1.5% or less. The carbon content is the maximum concentration in the region, and can be measured, for example, by an energy dispersive fluorescent X-ray spectrometer (EDX), an electron energy-loss spectroscopy (EELS), a secondary ion mass spectrometer (SIMS), or the like.

The impurities for gettering may include boron (B) and a boron compound, in addition to the above carbon. Boron (B) or boron compounds for use can be, for example, ions (boron cluster ions) of decaborane ($B_{10}H_{14}$), or octadecaborane ($B_{18}H_{22}$). After implanting these ions, the heat treatment is performed to form a gettering site made of boron elements. The region containing boron has a large gettering effect of ionic metals, such as copper (Cu).

Thus, the semiconductor substrate 1S has a main surface MS shown in FIG. 12, where the main surface MS includes a first area (active region AcTP) and a second area (active region AcG), where the first area and the second area are respectively surrounded by element isolation region LCS. The p-type well PWL forms a first semiconductor region of a first conductive type (p-type in this embodiment) in the semiconductor substrate 1S, where the first semiconductor region (p-type well PWL) extends to both the first area (active region AcTP) and the second area (active region AcG). The gettering region GET is formed in the first semiconductor region (p-type well PWL) at the second area (active region AcG), where the gettering region GET is a diffused region.

Figure 14:
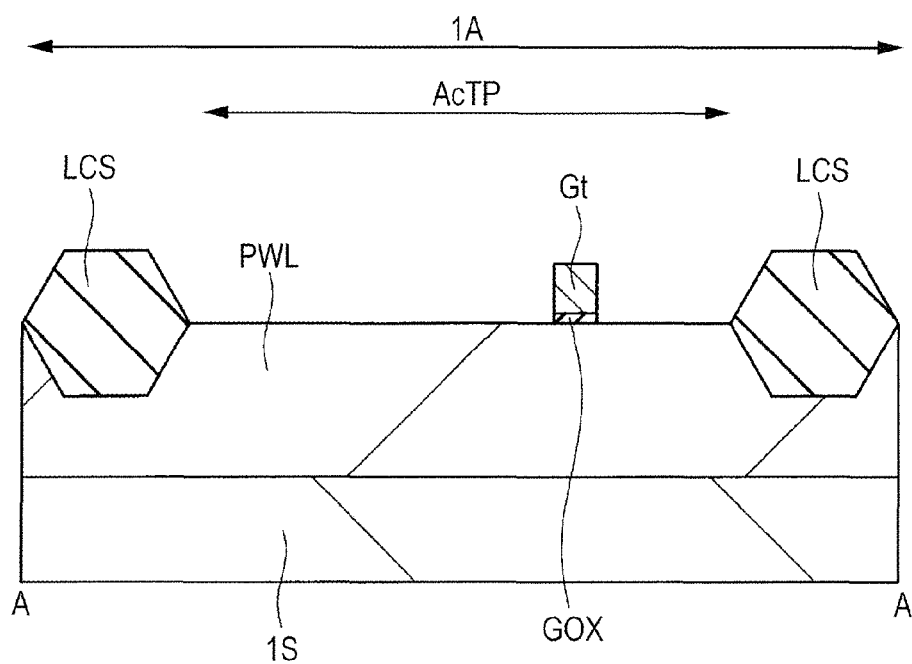
FIG. 14 is a cross-sectional view taken along the line A-A of FIG. 3, showing another manufacturing step of the semiconductor device in the first embodiment.
Figure 15:
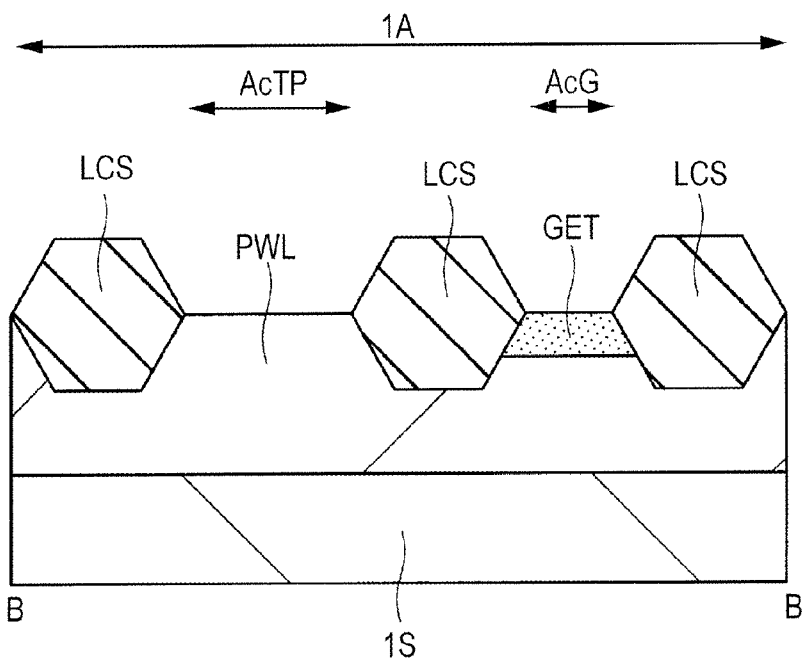
FIG. 15 is a cross-sectional view taken along the line B-B of FIG. 3, showing another manufacturing step of the semiconductor device in the first embodiment.
Figure 16:
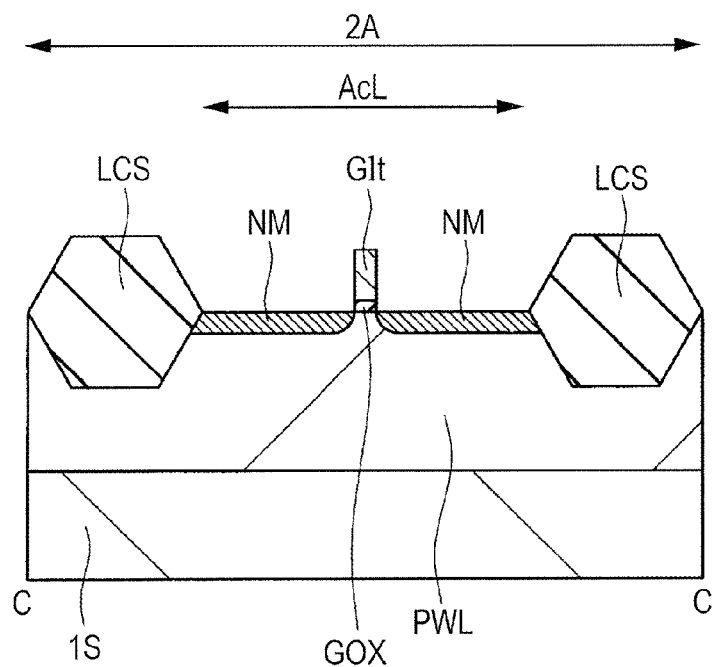
FIG. 16 is a cross-sectional view taken along the line C-C of FIG. 6, showing another manufacturing step of the semiconductor device in the first embodiment.

Then, as shown in FIGS. 14 to 16, the gate electrodes (Gt, G1t) are formed in the pixel region 1A and the peripheral circuit region 2A via the gate insulating film GOX. For example, the semiconductor substrate 1S is subjected to thermal oxidation, so that the gate insulating film GOX made of a silicon oxide film is formed over the p-type well PWL. Alternatively, a silicon nitride film or a silicon oxynitride film may be used as the gate insulating film GOX. Further, the gate insulating film for use may be a so-called high dielectric film (film with a dielectric constant higher than that of a silicon oxide film), such as a hafnium-based insulating film containing hafnium oxide with lanthanum oxide introduced thereinto. These films can be formed, for example, by chemical vapor deposition (CVD).

Next, a conductive film, for example, a polycrystalline silicon film is formed by the CVD method over the semiconductor substrate 1S including the gate insulating film GOX. Then, the conductive film is patterned. Specifically, a photoresist film (not shown) is formed over the conductive film, and subjected to exposure and development (photolithography), so that the photoresist film remains in regions where the gate electrodes (Gt, G1t) are to be formed. Thereafter, the conductive film and the silicon oxide film (gate insulating film GOX) are etched using the photoresist film as a mask to form the gate electrodes (Gt, G1t). Then, some parts of the photoresist film are removed by ashing. The process from formation of the photoresist film to removal thereof is referred to as "patterning". At this time, gate electrodes (Gr, Gs, Ga) of other transistors (reset transistor RST, selection transistor SEL, and amplifier transistor AMI) may be formed.

Then, n-type low-concentration semiconductor regions NM are formed in parts of the p-type well PWL on both sides of the gate electrode Glt. Specifically, n-type impurity ions are implanted using the gate electrode G1t and a photoresist mask (not shown) opened at the peripheral circuit region 2A as a mask. In this way, the n-type low-concentration semiconductor regions NM are formed in the p-type well PWL on both sides of the gate electrode G1t (see FIG. 16).

Figure 17:
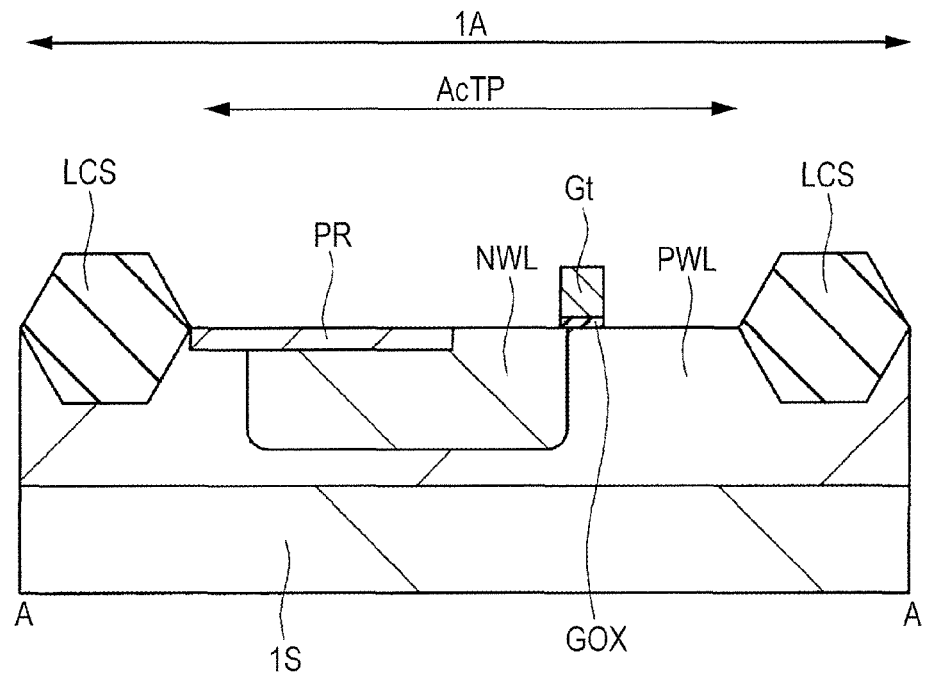
FIG. 17 is a cross-sectional view taken along the line A-A of FIG. 3, showing another manufacturing step of the semiconductor device in the first embodiment.
Figure 18:
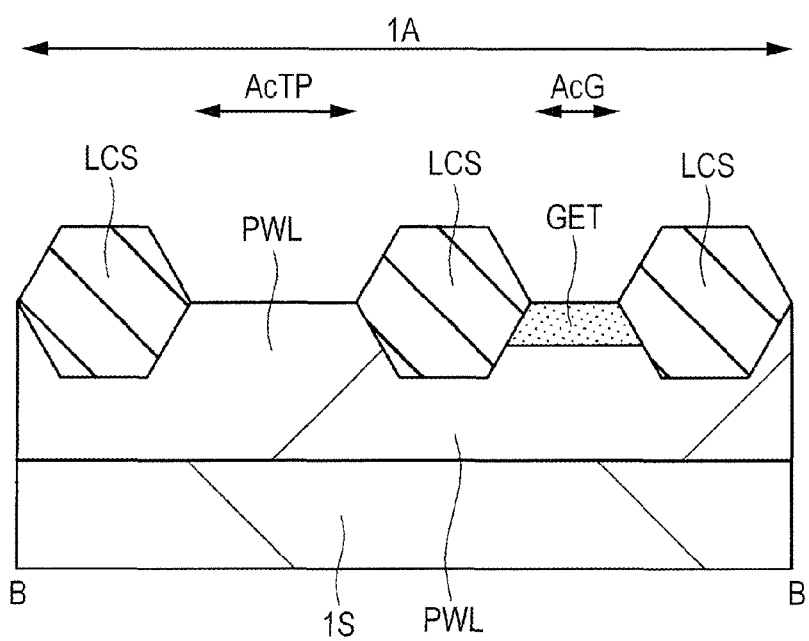
FIG. 18 is a cross-sectional view taken along the line B-B of FIG. 3, showing another manufacturing step of the semiconductor device in the first embodiment.
Figure 19:
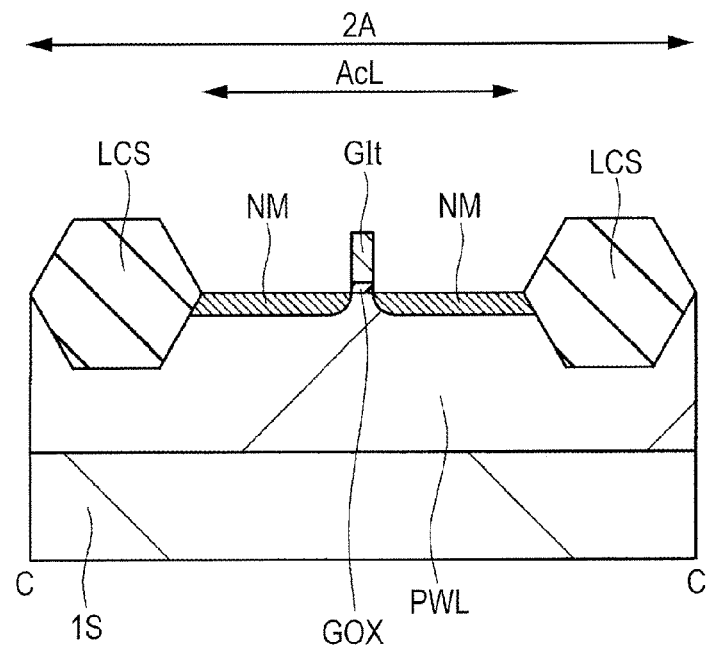
FIG. 19 is a cross-sectional view taken along the line C-C of FIG. 6, showing another manufacturing step of the semiconductor device in the first embodiment.

As shown in FIGS. 17 to 19, the n-type well NWL is formed in a part of the p-type well PWL on one side of the gate electrode G1t (on the left side shown in FIG. 17) in the pixel region 1A. Specifically, n-type impurity ions are implanted using a photoresist film (not shown) opened at one side of the gate electrode Gt as a mask. In this way, the n-type well NWL is formed to be positioned within the p-type well PWL (see FIG. 17). The p-type well PWL and the n-type well NWL form the photodiode. A part of the n-type well NWL is formed to be overlapped over the gate electrode Gt of the transfer transistor in the plan view. The part of the n-type well NWL is overlapped over the gate electrode Gt of the transfer transistor, so that the n-type well NWL can serve as the source region of the transfer transistor.

Thus, as shown in FIG. 17, the semiconductor substrate further has a second semiconductor region (n-type well NWL) of a second conductive type (n-type in this embodiment) opposite to the first conductive type formed in the first semiconductor region (the p-type well PWL) at the first area (active region AcTP) to form a PN junction with the first semiconductor region, where the second semiconductor region is disposed at one side of the gate electrode Gt in plan view.

Then, p-type impurity ions are implanted into the superficial region of the n-type well NWL by use of the lithography and ion implantation. Thus, the p$^+$-type semiconductor region PR is formed in the superficial region of the n-type well NWL (see FIG. 17). Thereafter, the annealing (heating) is performed on the substrate to restore the crystal defects caused by the ion implantation in the n-type well NWL. The annealing also has the effect of collecting the contaminant metals trapped in the previous processes into the gettering site.

Figure 20:
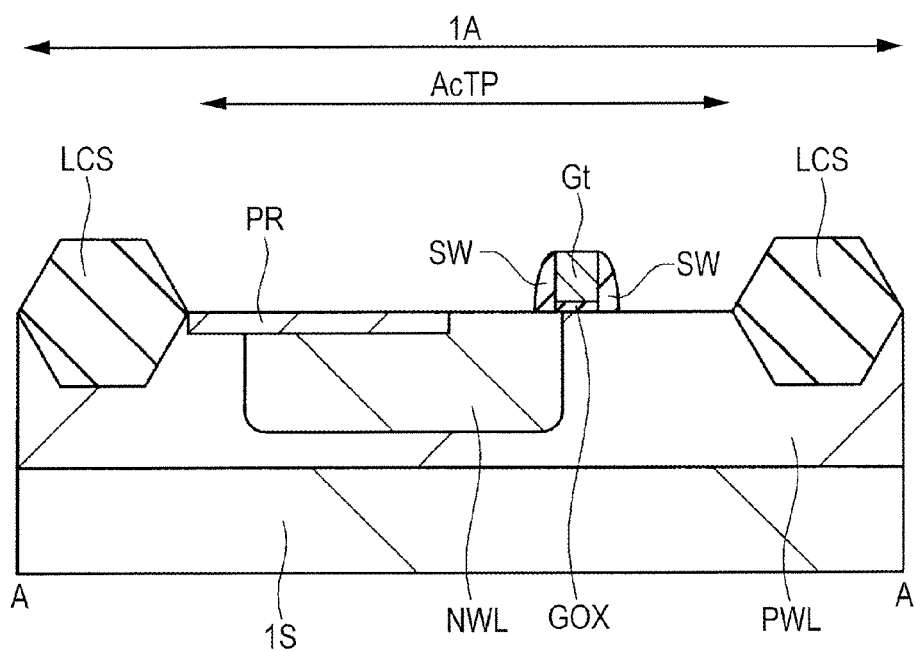
FIG. 20 is a cross-sectional view taken along the line A-A of FIG. 3, showing another manufacturing step of the semiconductor device in the first embodiment.
Figure 21:
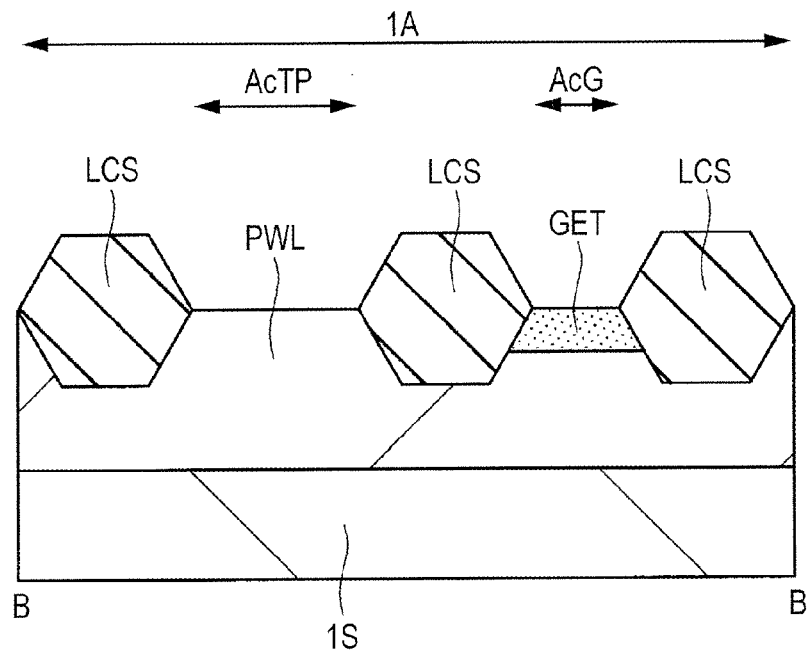
FIG. 21 is a cross-sectional view taken along the line B-B of FIG. 3, showing another manufacturing step of the semiconductor device in the first embodiment.
Figure 22:
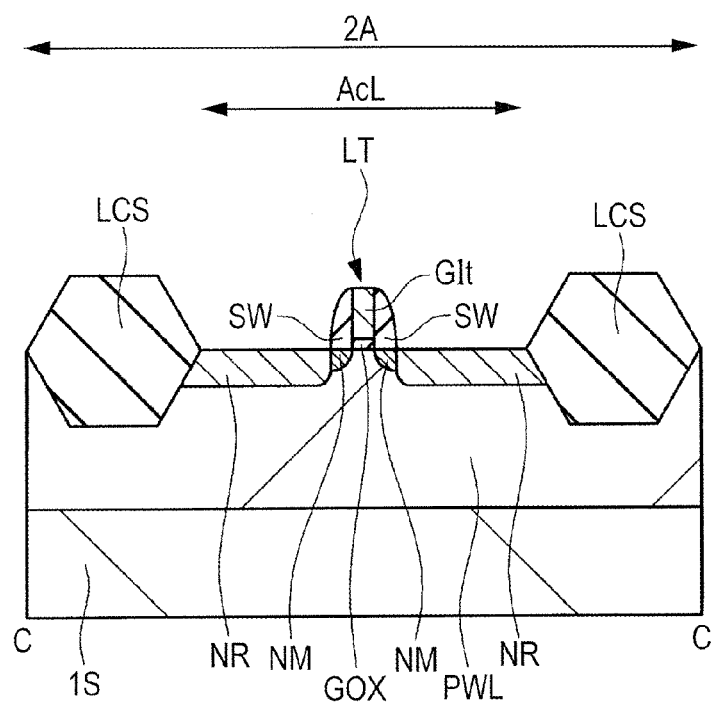
FIG. 22 is a cross-sectional view taken along the line C-C of FIG. 6, showing another manufacturing step of the semiconductor device in the first embodiment.

Next, as shown in FIGS. 20 to 22, the sidewalls (sidewall insulating films, sidewall spacers) SW are formed of an insulating film at the side walls of the gate electrodes (Gt, G1t). Further, n-type high-concentration semiconductor regions NR are formed in parts of the p-type well PWL on both side of the combination of the gate electrode G1t and the sidewalls SW. Specifically, a silicon oxide film or silicon nitride film or a lamination thereof is deposited as an insulating film over the semiconductor substrate 1S by the CVD method or the like. The insulating film is subjected to anisotropic etching using reactive ion etching (RIE) or the like. In this way, the sidewalls SW made of the insulating film can remain at the side walls of the gate electrodes (Gt, G1t). Then, for example, n-type impurity ions are implanted using the gate electrode G1t, the sidewalls SW, and a photoresist film (not shown) opened in the peripheral circuit region 2A, as a mask. Thus, the n-type high-concentration semiconductor regions NR are formed in the p-type well PWL on both sides of the combination of the gate electrode G1t and the sidewalls SW (see FIG. 22). Then, the photoresist film (not shown) used for the ion implantation is removed by ashing or the like. Thus, the source and drain regions of the transistor LT, that is, the source and drain regions of the LDD structure composed of the n-type low-concentration semiconductor region NM and the n-type high-concentration semiconductor region NR can be formed.

Figure 23:
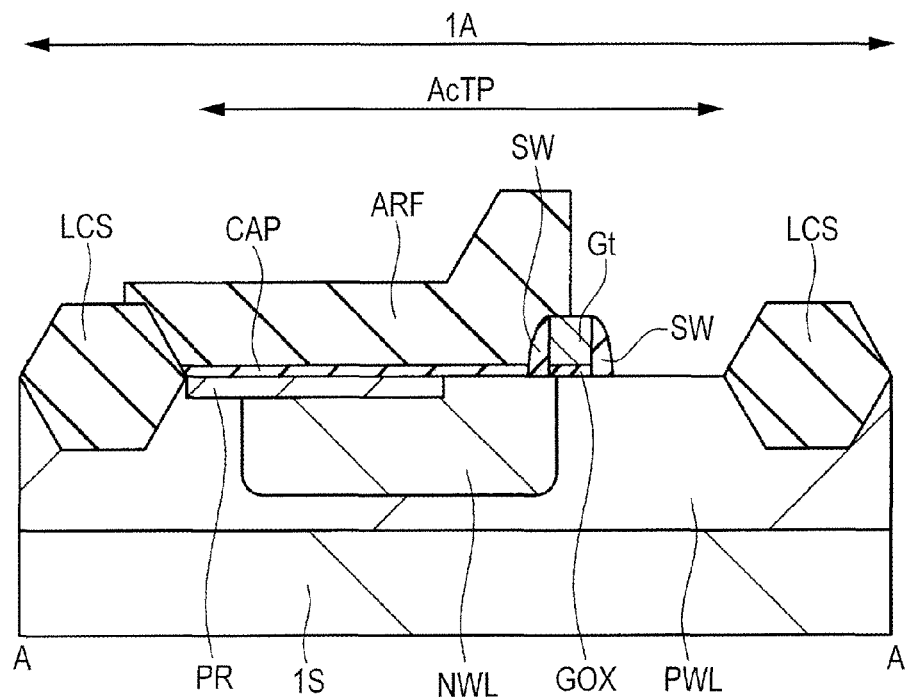
FIG. 23 is a cross-sectional view taken along the line A-A of FIG. 3, showing another manufacturing step of the semiconductor device in the first embodiment.
Figure 24:
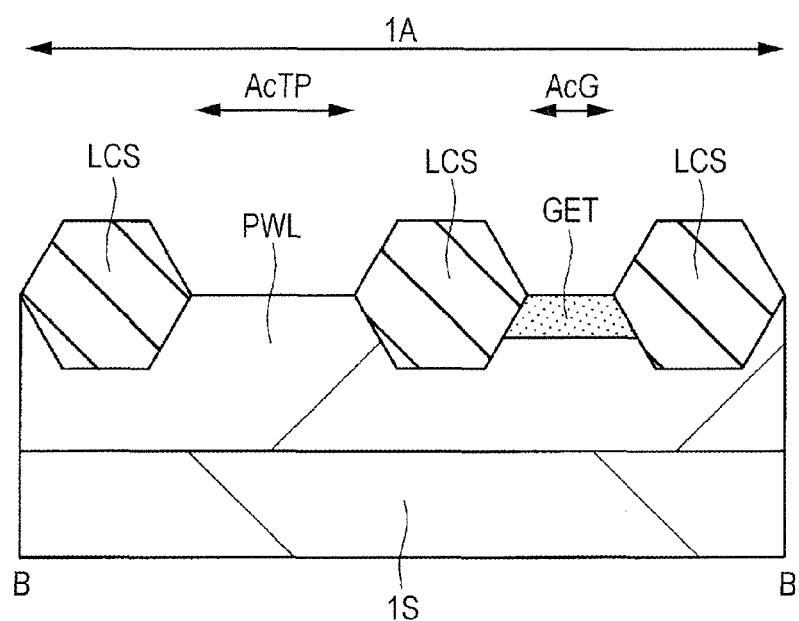
FIG. 24 is a cross-sectional view taken along the line B-B of FIG. 3, showing another manufacturing step of the semiconductor device in the first embodiment.
Figure 25:
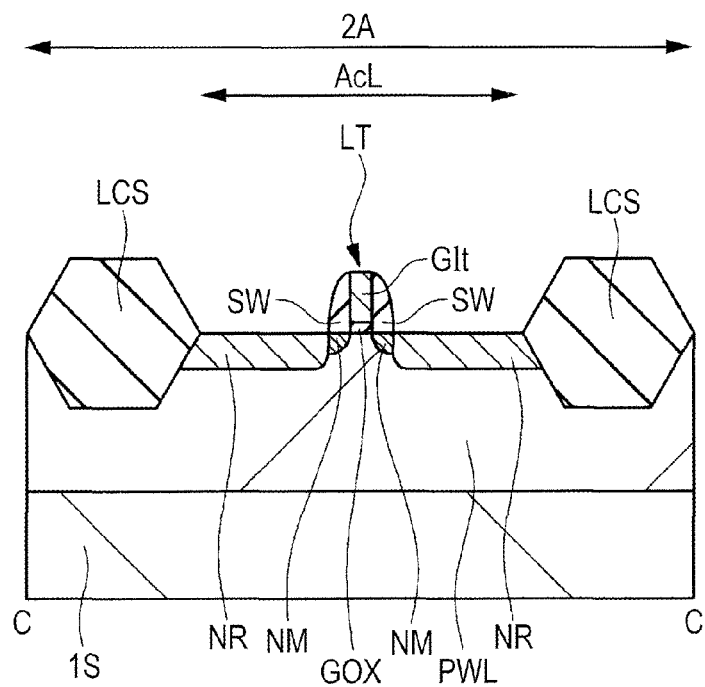
FIG. 25 is a cross-sectional view taken along the line C-C of FIG. 6, showing another manufacturing step of the semiconductor device in the first embodiment.

Then, as shown in FIGS. 23 to 25, the cap insulating film CAP and the reflection preventing film ARF are formed in the pixel region 1A. Specifically, a silicon oxide film is formed over the semiconductor substrate 1S as the insulating film by the CVD method, and then the insulting film is patterned. In this way, the cap insulating film CAP formed of the silicon oxide film is formed over the n-type well NWL on one side of the gate electrode Gt and over the superficial region of the p$^+$-type semiconductor region PR. Alternatively, a silicon nitride film may be used instead of the silicon oxide film.

Next, the reflection preventing film ARF, for example, a silicon oxynitride film is formed over the semiconductor substrate 1S by the CVD method or the like, and then patterned. Thus, the reflection preventing film ARF is formed over the cap insulting film CAP on one side of the gate electrode Gt.

Figure 26:
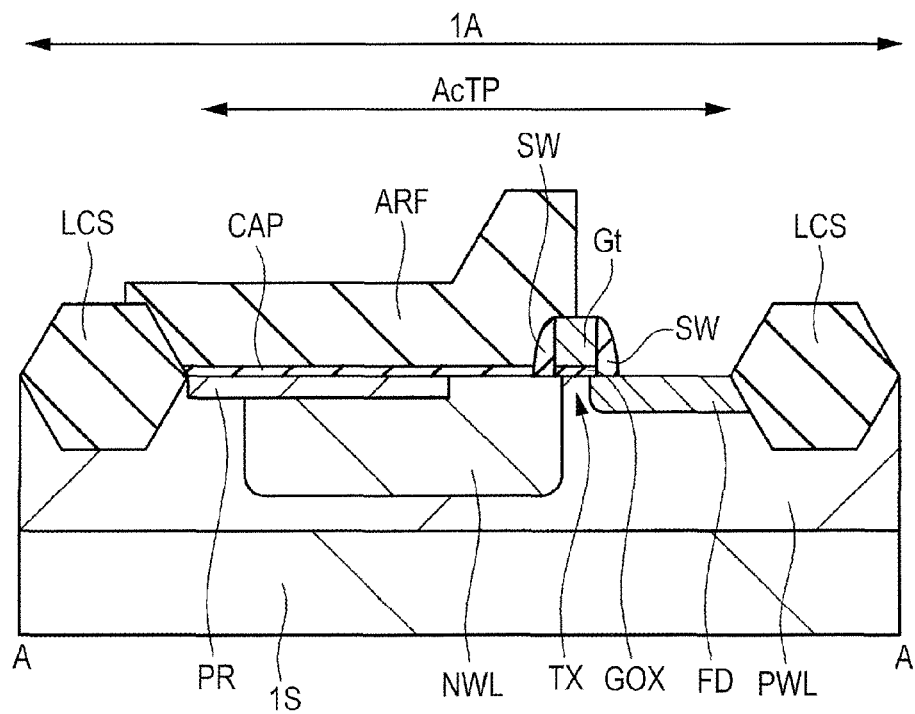
FIG. 26 is a cross-sectional view taken along the line A-A of FIG. 3, showing another manufacturing step of the semiconductor device in the first embodiment.
Figure 27:
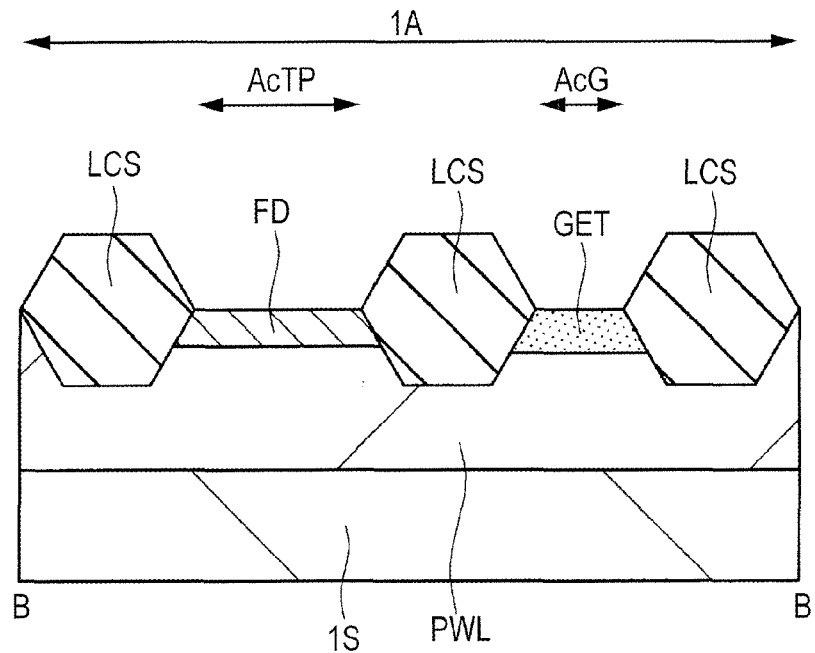
FIG. 27 is a cross-sectional view taken along the line B-B of FIG. 3, showing another manufacturing step of the semiconductor device in the first embodiment.
Figure 28:
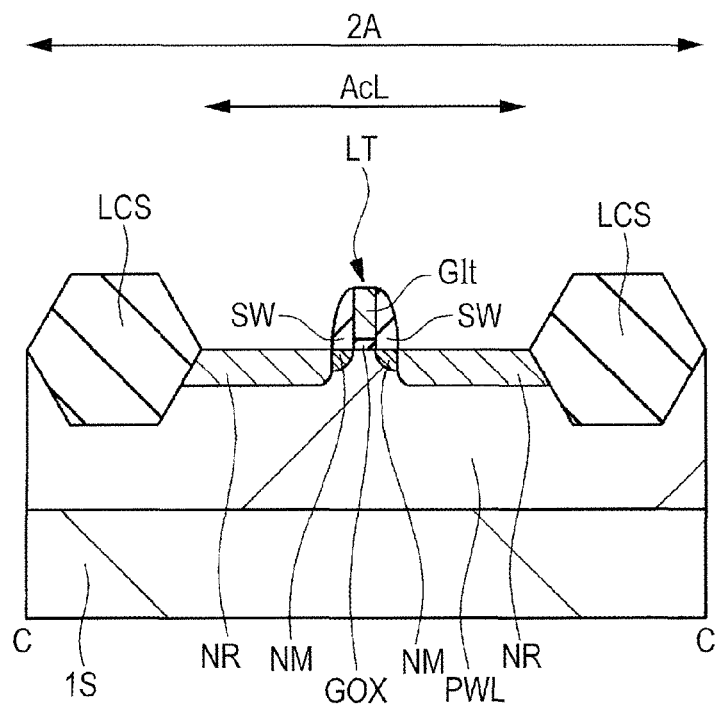
FIG. 28 is a cross-sectional view taken along the line C-C of FIG. 6, showing another manufacturing step of the semiconductor device in the first embodiment.

Then, as shown in FIGS. 26 to 28, the floating diffusion (n$^+$-type semiconductor region) FD is formed in the part of the p-type well PWL on the other side of the gate electrode Gt (on the right side shown in FIG. 26) in the pixel region 1A. Specifically, n-type impurity ions are implanted using the gate electrode Gt and a photoresist film (not shown) opened on the other side of the gate electrode Gt. In this way, the floating diffusion FD is formed in the p-type well PWL on the other side of the gate electrode Gt of the transfer transistor TX (on the right side shown in FIG. 26) (see FIG. 26). The above process may be used to form the source and drain regions (n-type high-concentration semiconductor regions) of other transistors (reset transistor RST, selection transistor SEL, and amplifier transistor AMI). Further, the above process may be used to form the source and drain regions (n-type high-concentration semiconductor regions) of the above transistor LT.

Thus, as shown in FIG. 26, the semiconductor substrate 1S further includes a third semiconductor region (the floating diffusion n+-type semiconductor region FD) of the second conductive type (n-type in this embodiment) formed in the first semiconductor region (p-type well PWL) at the first area (active region AcTP) and disposed at the other side of gate electrode Gt in plan view.

Next, the source and drain regions (p-type high-concentration semiconductor regions) of the p-type MOSFET in the peripheral circuit region 2A may be formed. Specifically, p-type impurity ions are implanted into parts of the n-type well on both sides of the gate electrode of the p-type MOSFET (not shown) in the peripheral circuit region 2A. The p-type impurity ions can include, for example, boron (B). In this case, boron (B) may be ion-implanted into the active region AcG (gettering region GET).

Then, activation annealing is performed on the substrate so as to activate the impurities implanted in the above processes. The activation annealing also serve to collect the contaminant metals trapped in the previous processes into the gettering site. The order of implantation of the respective kinds of impurities is not limited to that disclosed in the above processes. In order to form the semiconductor regions of the same conduction type, impurities can be simultaneously implanted into the regions at one time. In this way, the implantation process of the respective impurities can be adjusted.

In the above processes, the photodiode (PD), the transfer transistor TX, and other transistors (reset transistor RST, selection transistor SEL, and amplifier transistor AMI) not shown in the cross-sectional views of FIGS. 11 to 28 are formed in the pixel region 1A of the semiconductor substrate 1S. The transistor LT is also formed in the peripheral circuit region 2A of the semiconductor substrate 1S (see FIGS. 3 and 6).

Figure 29:
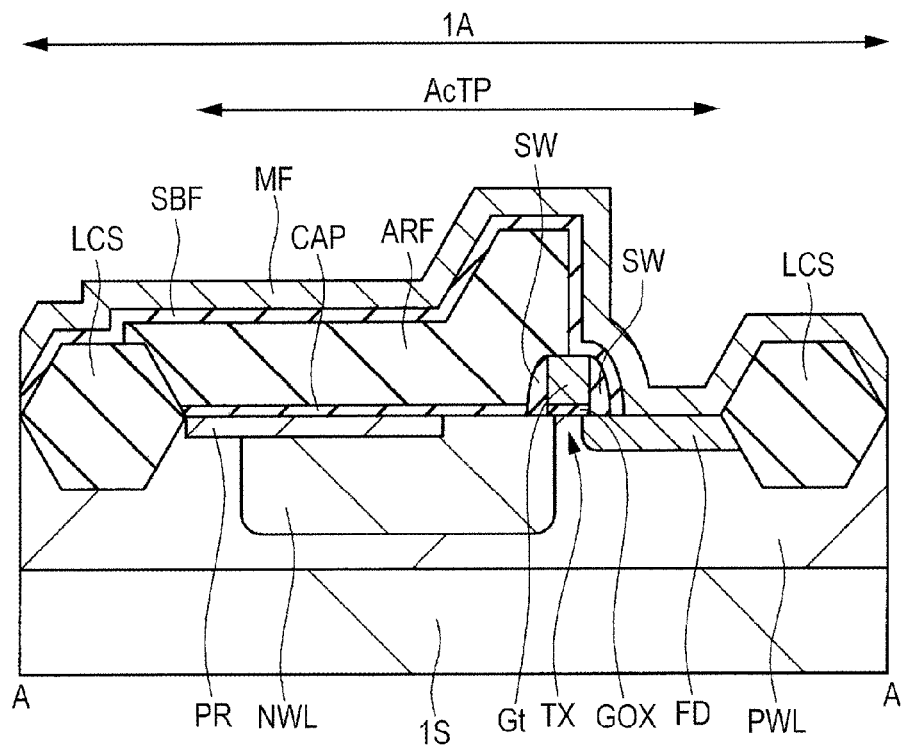
FIG. 29 is a cross-sectional view taken along the line A-A of FIG. 3, showing another manufacturing step of the semiconductor device in the first embodiment.
Figure 30:
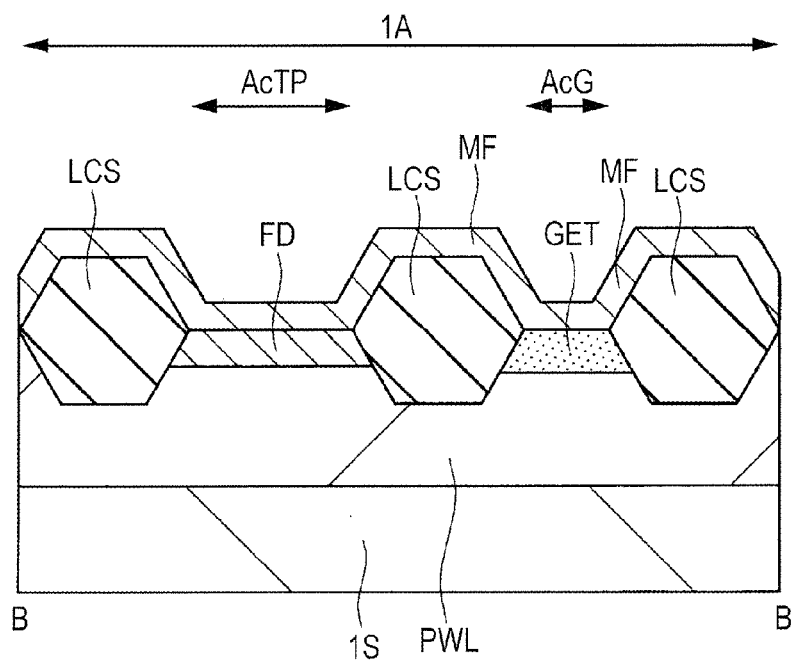
FIG. 30 is a cross-sectional view taken along the line B-B of FIG. 3, showing another manufacturing step of the semiconductor device in the first embodiment.
Figure 31:
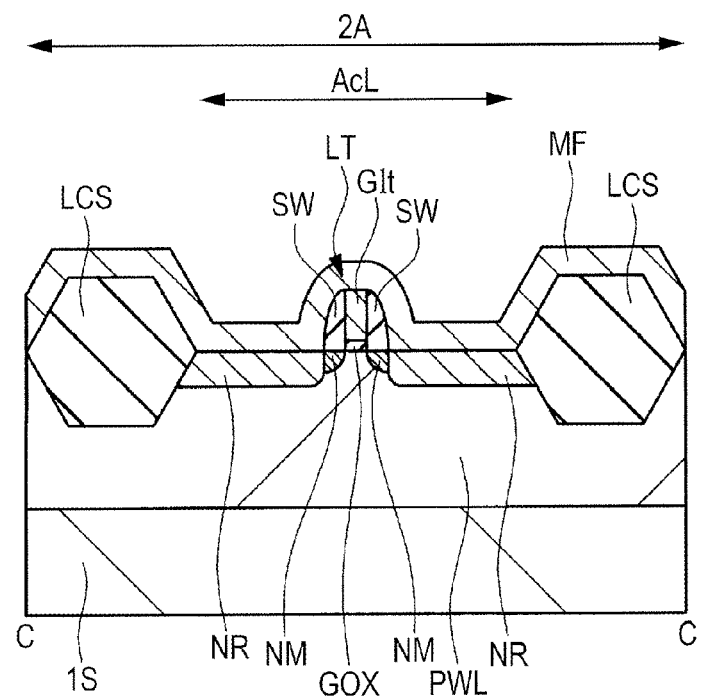
FIG. 31 is a cross-sectional view taken along the line C-C of FIG. 6, showing another manufacturing step of the semiconductor device in the first embodiment.
Figure 32:
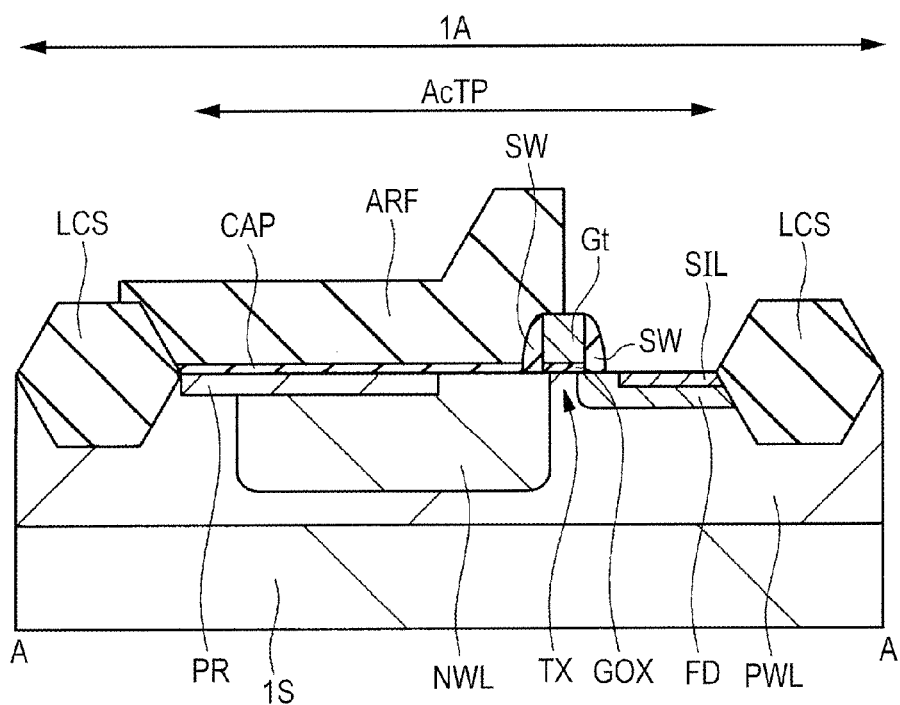
FIG. 32 is a cross-sectional view taken along the line A-A of FIG. 3, showing another manufacturing step of the semiconductor device in the first embodiment.
Figure 33:
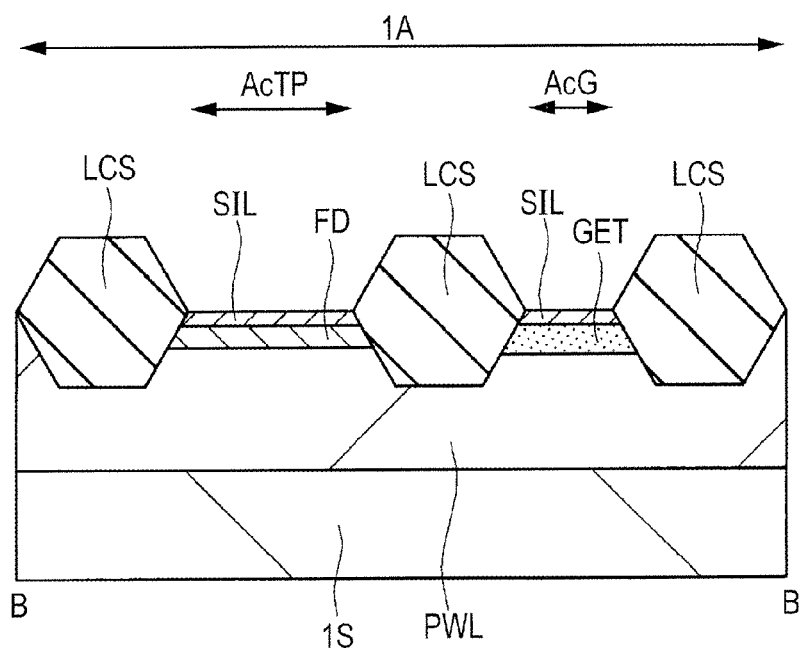
FIG. 33 is a cross-sectional view taken along the line B-B of FIG. 3, showing another manufacturing step of the semiconductor device in the first embodiment.
Figure 34:
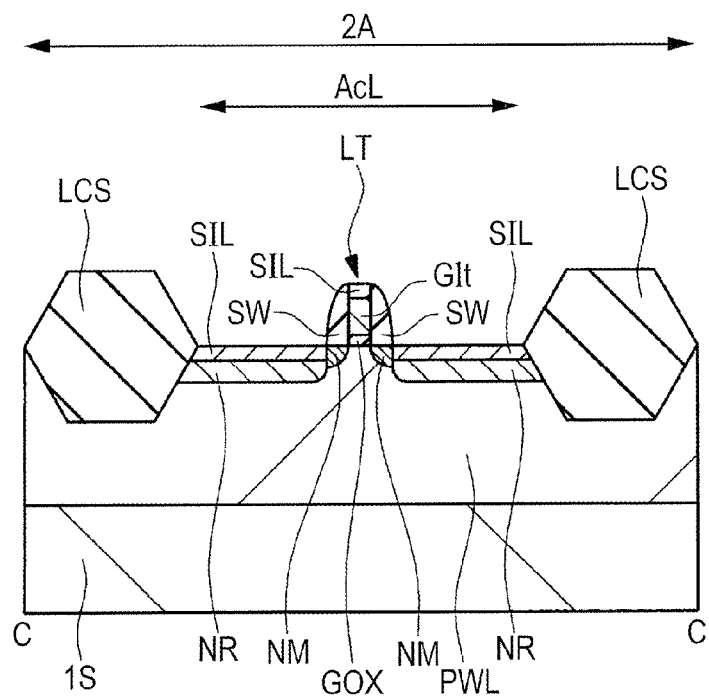
FIG. 34 is a cross-sectional view taken along the line C-C of FIG. 6, showing another manufacturing step of the semiconductor device in the first embodiment.

Then, as shown in FIGS. 29 to 31, after forming a silicide blocking film SBF, a metal film MF is formed. Specifically, the silicon oxide film is formed as an insulating film over the semiconductor substrate 1S by the CVD method, and then patterned, which forms the silicide blocking film SBF with an opening over the floating diffusion FD to cover the reflection preventing film ARF and the gate electrode Gt. In regions not needing the formation of the silicide film SIL, the silicide blocking film (silicon oxide film) SBF remains.

Then, the metal film MF, for example, a nickel (Ni) film is formed over the semiconductor substrate 1S by sputtering or the like. The metal film for use may be a metal film, such as a nickel film, a titanium (Ti) film, a cobalt (Co) film, or a platinum (Pt) film, or an alloy film thereof. Then, heat treatment is applied to the semiconductor substrate 1S to cause the metal film MF to react with silicon included in the semiconductor substrate 1S (floating diffusion FD, gettering region GET, n$^+$-type semiconductor region NR) to thereby form the silicide film (herein, a nickel silicide film). Further, the metal film MF reacts with silicon included in the gate electrode G1t to form the silicide film SIL. Then, a non-reacted metal film MF is removed. In this way, the silicide film (metal silicide film) SIL is formed over the floating diffusion FD and the gettering region GET in the pixel region 1A, and the silicide film SIL is formed over the gate electrode G1t and the n$^+$-type semiconductor region NR in the peripheral circuit region 2A (see FIGS. 32 to 34). At this time, the silicide film is formed over the source and drain regions (n+-type semiconductor regions) and the gate electrodes (Gr, Gs, Ga) of other transistors (not shown) (reset transistor RST, selection transistor SEL, and amplifier transistor AMI). The silicide film SIL can decrease the connection resistance between the contact and the respective regions. In formation of the metal silicide, the metal contamination might be caused by the metal film MF. In this embodiment, however, the presence of the gettering region GET can reduce the contaminant metals.

Figure 36:
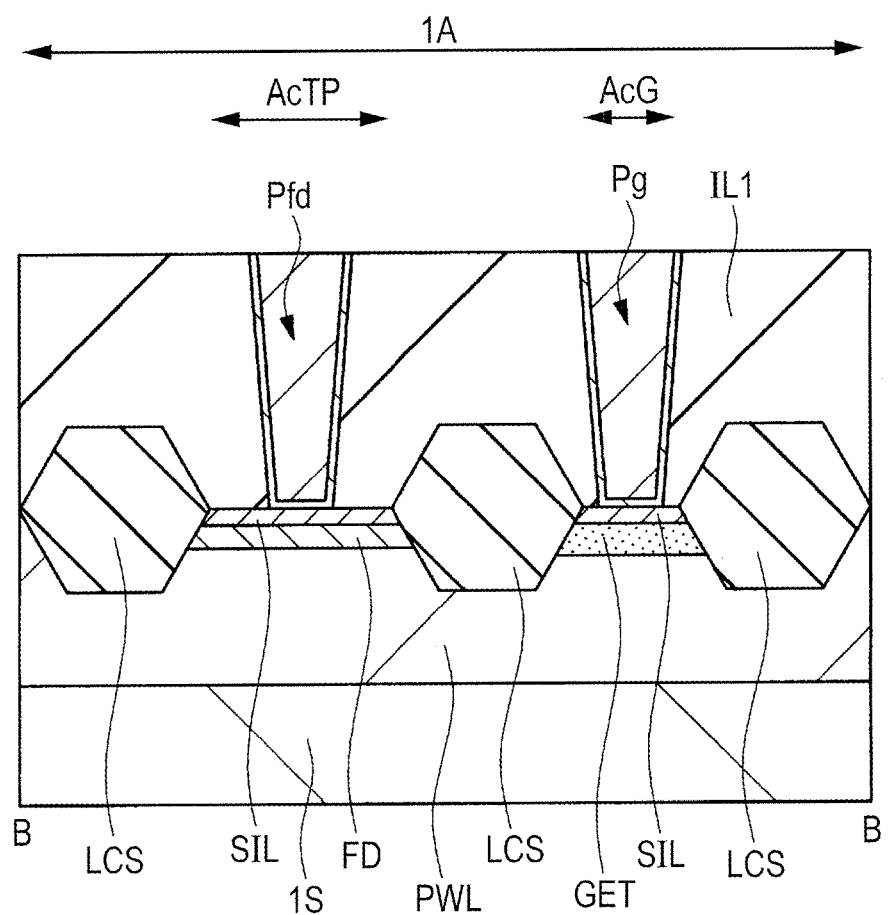
FIG. 36 is a cross-sectional view taken along the line B-B of FIG. 3, showing another manufacturing step of the semiconductor device in the first embodiment.

Thus, as shown in FIG. 36, a lower surface of silicide layer SIL (also denoted the first silicide layer) contacts a upper surface of the gettering region GET.

Figure 35:
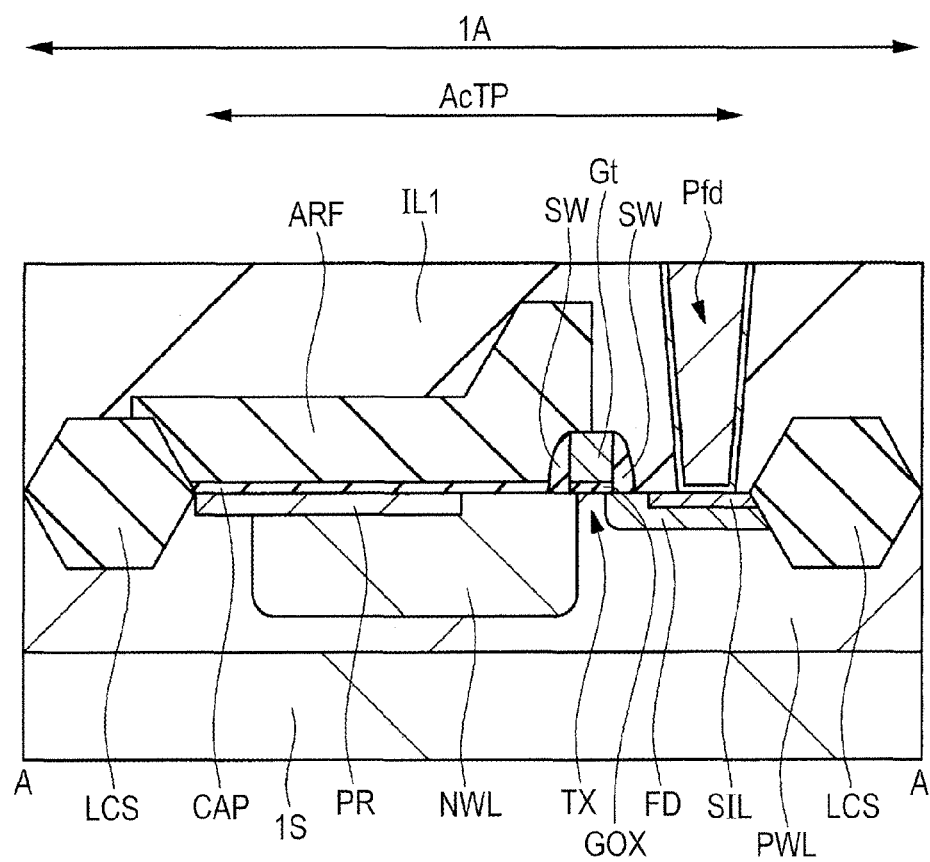
FIG. 35 is a cross-sectional view taken along the line A-A of FIG. 3, showing another manufacturing step of the semiconductor device in the first embodiment.
Figure 37:
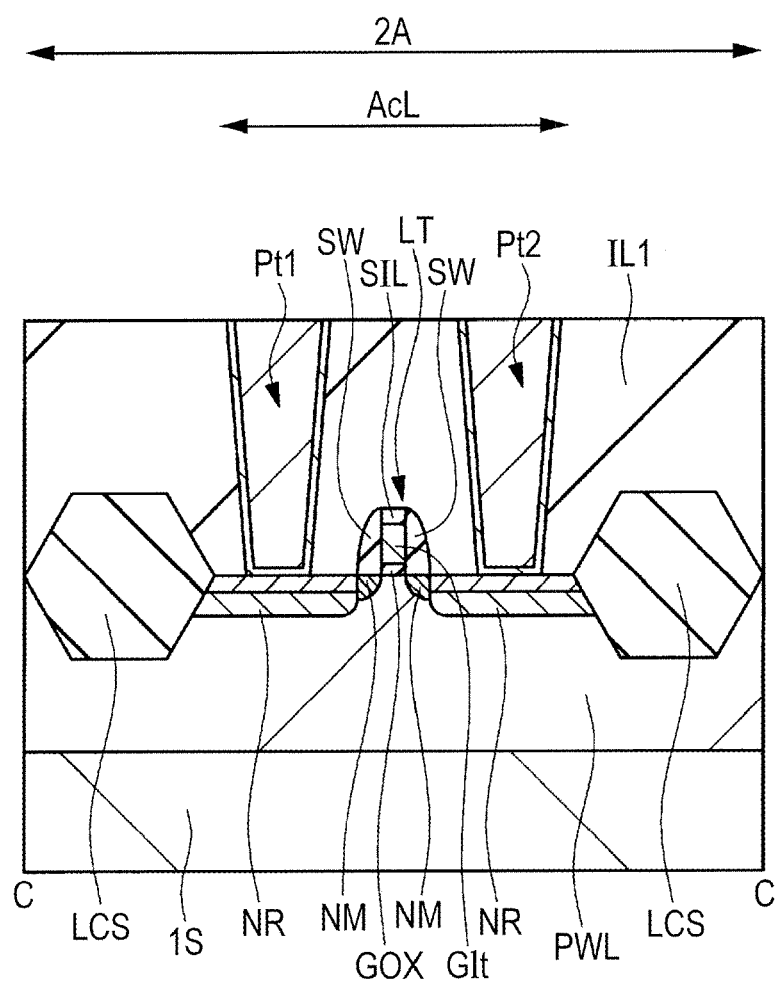
FIG. 37 is a cross-sectional view taken along the line C-C of FIG. 6, showing another manufacturing step of the semiconductor device in the first embodiment.

Next, as shown in FIGS. 35 to 37, an interlayer insulating film IL1 and contacts (Pfd, Pg, Pt1, Pt2, and the like) are formed. Specifically, a silicon oxide film is deposited over the semiconductor substrate 1S by the CVD method using a tetra ethyl ortho silicate (TEOS) gas as a raw material gas. Thereafter, if necessary, the surface of the interlayer insulating film IL1 is flattened by chemical mechanical polishing (CMP) or the like.

Then, the interlayer insulating film IL1 is patterned to form contact holes over the floating diffusion FD, the n+-type semiconductor region NR, and the gettering region GET (silicide film SIL). At this time, a contact hole is also formed over the gate electrode Gt of the transfer transistor TX. Additionally, contact holes are further formed over the source and drain regions (silicide film) and gate electrodes (Gr, Gs, Ga) of other transistors not shown in the cross-sectional views (reset transistor RST, selection transistor SEL, amplifier transistor AMI).

Then, a conductive film is embedded in each contact hole to thereby form the contacts (Pfd, Pg, Pt1, Pt2, and the like). For example, a laminated film of a titanium film and a titanium nitride film is deposited as a barrier film over the interlayer insulating film IL1 including the inside of each contact hole. The barrier film serves to suppress the diffusion of a main conductive film (made of tungsten) into each component inside the semiconductor substrate 1S as will be described later.

Next, a tungsten (W) film is deposited by the CVD method as a main conductive film over the barrier film in such a thickness that can fill the contact hole. Then, unnecessary parts of the barrier film and the main conductive film over the interlayer insulating film IL1 are removed using the CMP method or the like. In this way, the contacts (Pfd, Pg, Pt1, Pt2, and the like) made of the barrier film and the main conductive film are formed inside the contact holes.

Figure 38:
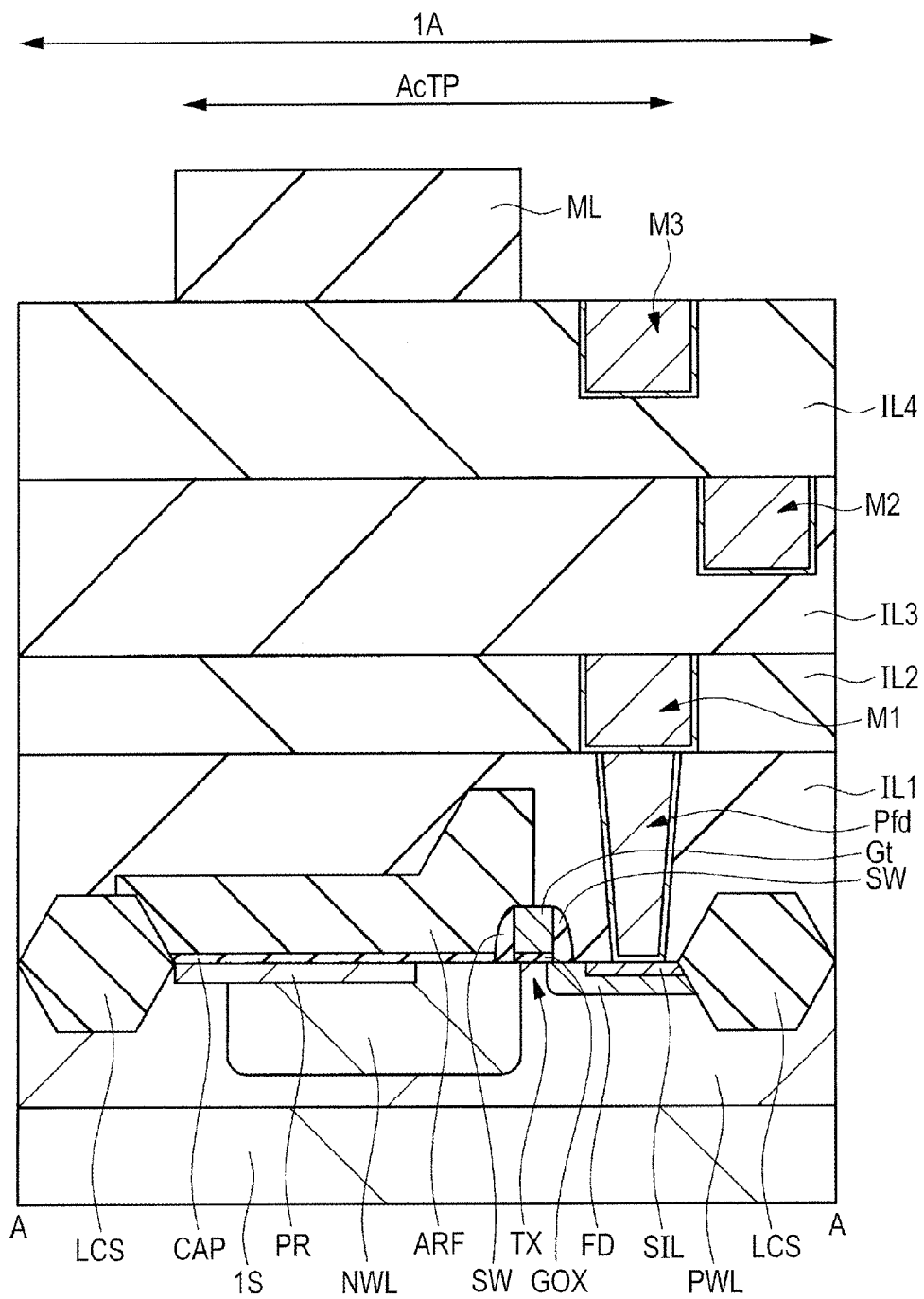
FIG. 38 is a cross-sectional view taken along the line A-A of FIG. 3, showing another manufacturing step of the semiconductor device in the first embodiment.
Figure 39:
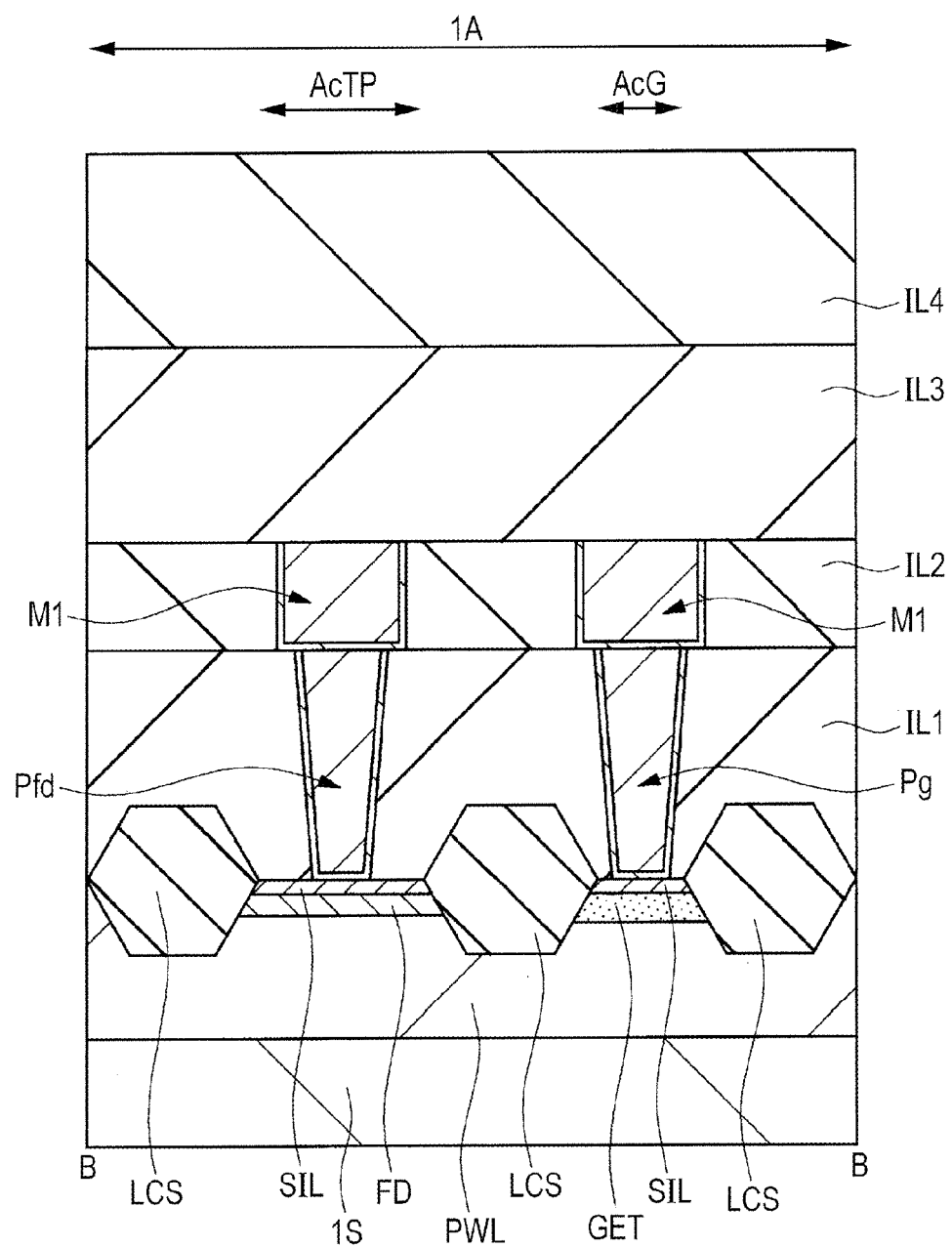
FIG. 39 is a cross-sectional view taken along the line B-B of FIG. 3, showing another manufacturing step of the semiconductor device in the first embodiment.
Figure 40:
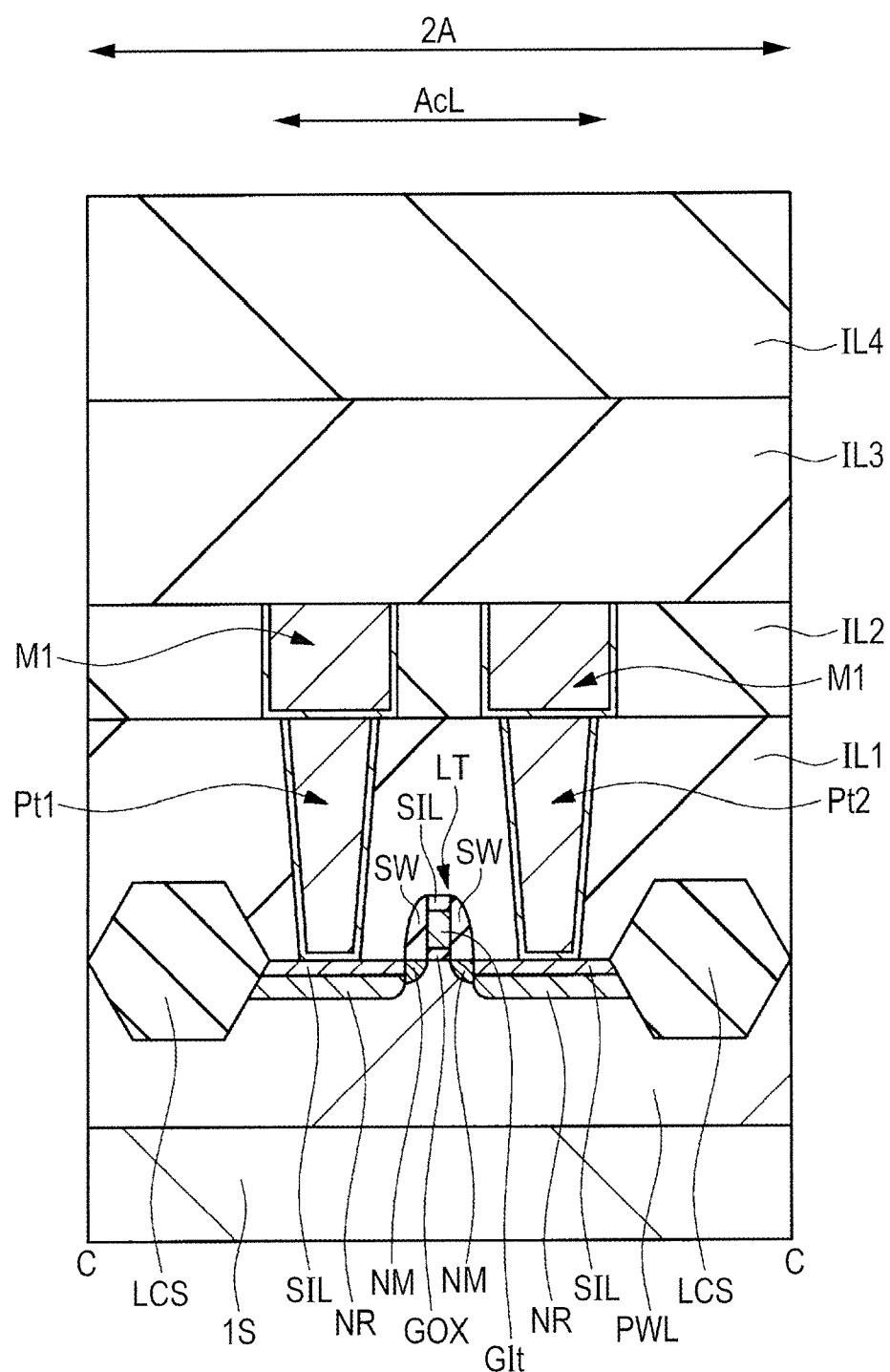
FIG. 40 is a cross-sectional view taken along the line C-C of FIG. 6, showing another manufacturing step of the semiconductor device in the first embodiment.

Then, as shown in FIGS. 38 to 40, interlayer insulating films (IL2 to IL4) and wirings (M1 to M3) are formed over the contacts (Pfd, Pg, Pt1, Pt2, and the like). Specifically, a laminated film of a silicon nitride film and a silicon oxide film thereover is formed as the interlayer insulating film IL2 over the interlayer insulating film IL1 by the CVD method. Then, the laminated film is patterned to form wiring trenches. A laminated film comprised of a tantalum (Ta) film and a tantalum nitride (TaN) film thereover is deposited as the barrier film over the interlayer insulating film IL2 including the inside of the wiring trench by sputtering or the like. Then, a thin copper film is deposited as a seed film (not shown) over the barrier film by the sputtering or the like, and electrolytic plating is performed to deposit a copper film over the seed film.

Then, unnecessary parts of the barrier film, seed film, and copper film over the interlayer insulating film IL2 are removed by the CMP method and the like. In this way, the barrier film, the seed film, and the copper film can be embedded in the wiring trenches to form the first wiring layer M1 (single Damascene method).

Thereafter, contacts (not shown) and the second wiring layer M2 are formed in the interlayer insulating film IL3, and contacts (not shown) and the third wiring layer M3 are formed in the interlayer insulating film IL4. For example, the contact holes and the wiring trenches are formed in the interlayer insulating film IL3, and the barrier film, the seed film, and the copper film are embedded in the holes and trenches to thereby form the contacts (not shown) and the second wiring layer M2 at the same time (dual Damascene method). Further, contacts (not shown) and the third wiring layer M3 can also be formed in the interlayer insulating film IL4 in the same way. A wiring may also be formed over the third wiring layer M3.

Although in the above process, the conductive film, such as a copper film, is embedded in the wiring trench to form the wiring (Damascene method), the wiring may be formed by patterning. Specifically, a conductive film, such as an aluminum film, may be deposited over the interlayer insulating film IL1 by sputtering or the like, and then patterned to form the first wiring layer M1. The second wiring layer M2 and the third wiring layer M3 may also be formed by patterning the conductive film in the same way.

A microlens (on-chip lens) ML is attached over the uppermost interlayer insulating film IL4 so as to be superimposed over the photodiode (n-type well NWL) in the plan view (see FIG. 38). A color filter may also be provided between the microlens ML and the interlayer insulating film IL4.

In the above-mentioned processes, the semiconductor device of this embodiment can be formed.

Figure 41:
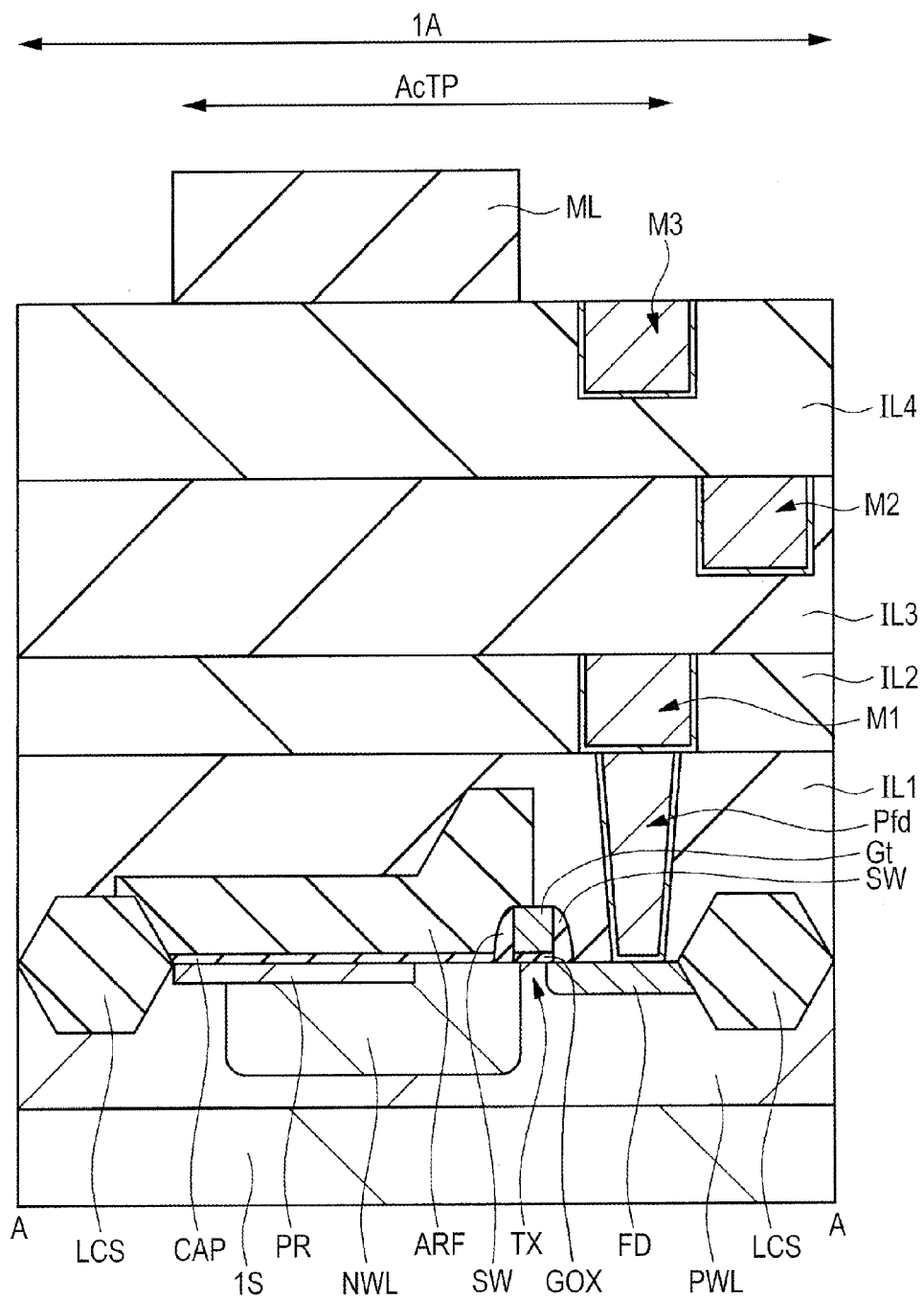
FIG. 41 is a cross-sectional view taken along the line A-A of FIG. 3, showing another structure of the semiconductor device in the first embodiment.
Figure 42:
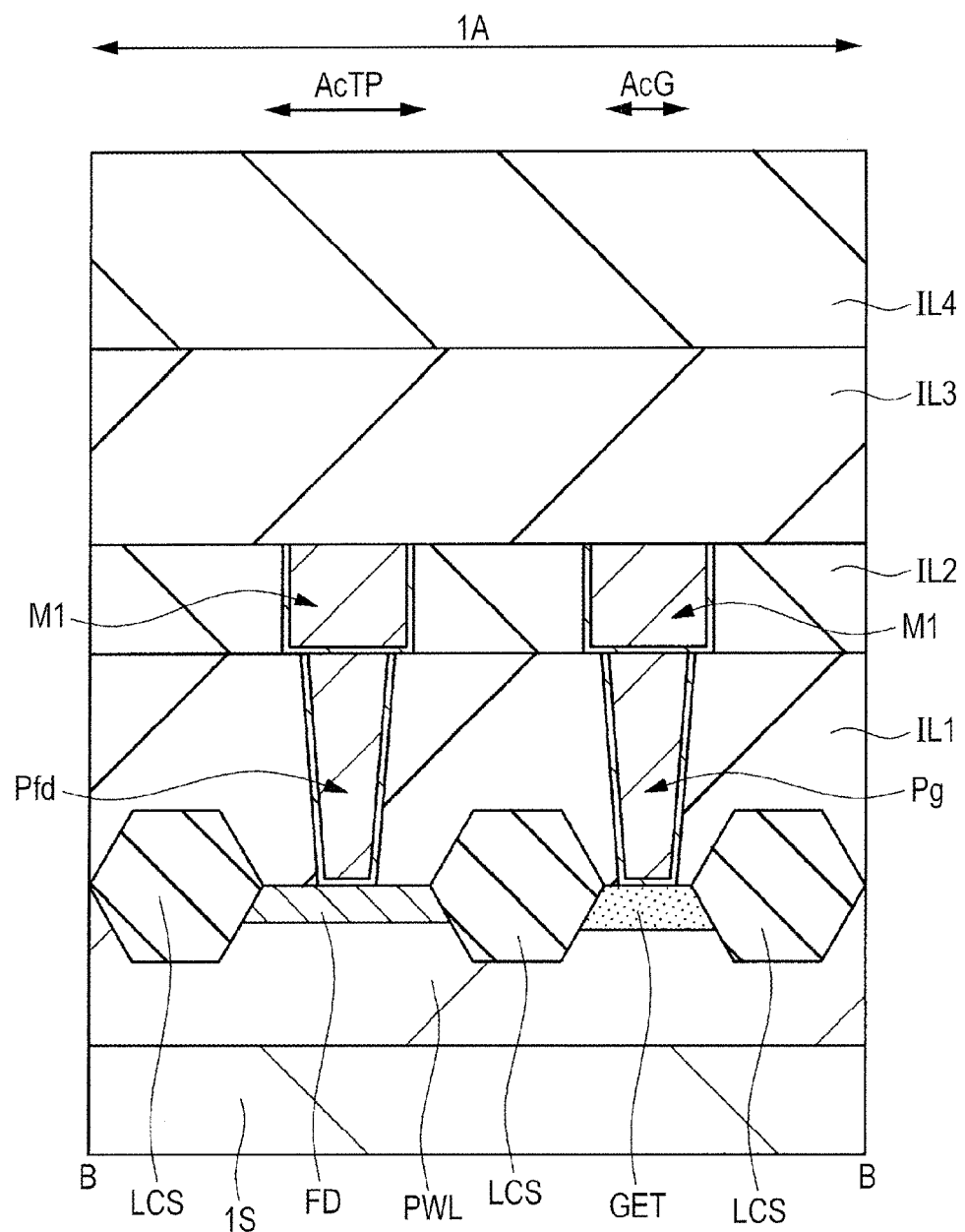
FIG. 42 is a cross-sectional view taken along the line B-B of FIG. 3, showing another structure of the semiconductor device in the first embodiment.
Figure 43:
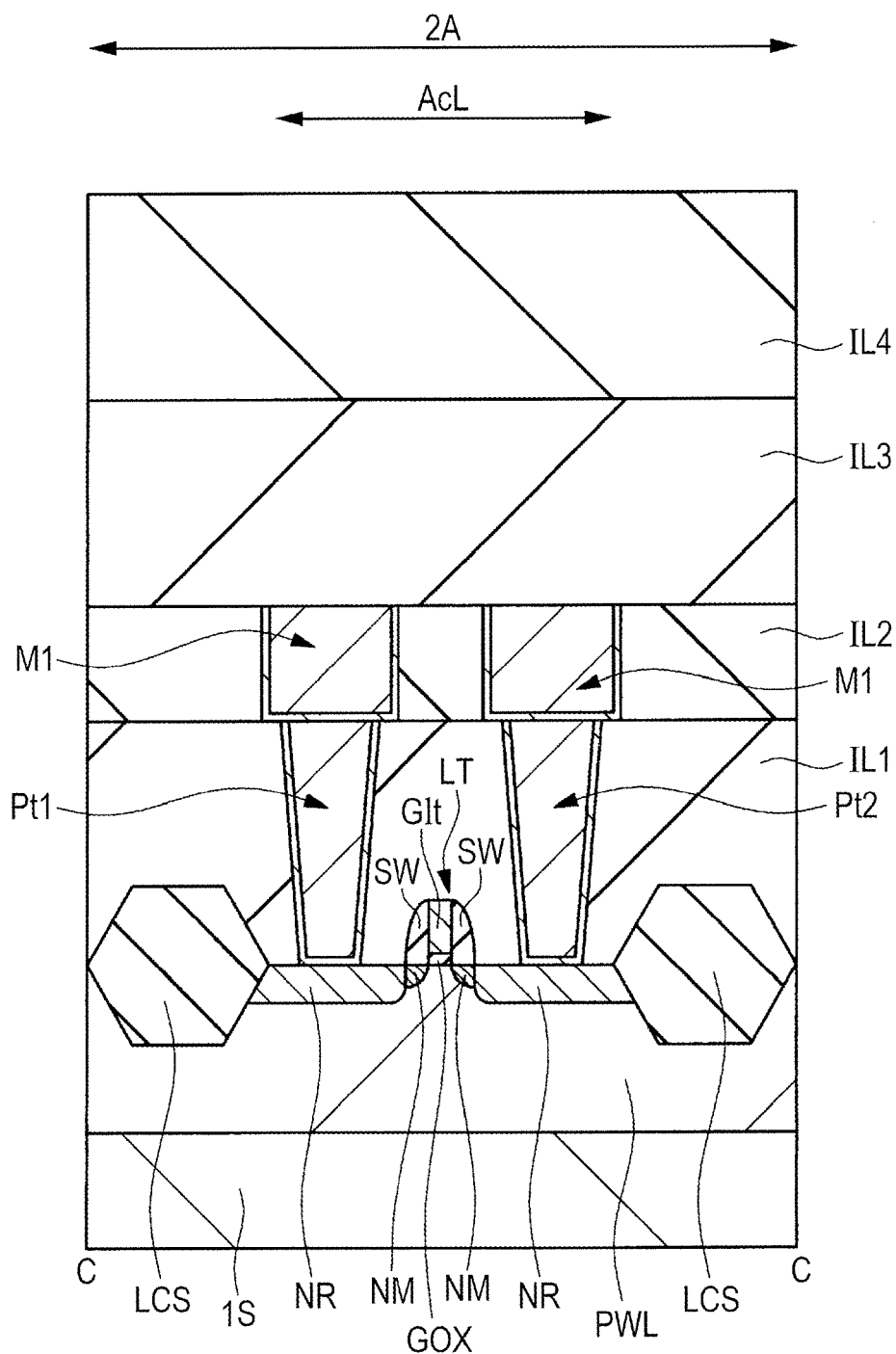
FIG. 43 is a cross-sectional view taken along the line C-C of FIG. 6, showing another structure of the semiconductor device in the first embodiment.

In the above step, the silicide film (metal silicide film) SIL is formed, but the silicide film may be omitted. FIGS. 41 to 43 show cross-sectional views of another structure of the semiconductor device in this embodiment. FIG. 41 corresponds to the cross-sectional view taken along the line A-A of FIG. 3. FIG. 42 corresponds to the cross-sectional view taken along the line B-B of FIG. 3. FIG. 43 corresponds to the cross-sectional view taken along the line C-C of FIG. 6.

As shown in FIGS. 41 to 43, the silicide film SIL may be omitted. In this case, the contacts (Pfd, Pg) are disposed directly over the floating diffusion FD and the gettering region GET, respectively, in the pixel region 1A (see FIGS. 41 and 42). The contacts (Pt1, Pt2) are disposed directly over the n+-type semiconductor region NR in the peripheral circuit region 2A (see FIG. 43).

Thus, in this embodiment, the gettering region GET can be provided in the surface of the active region AcG to trap therein the contaminant metals (for example, W, Mo, Fe, Co, Ni and the like). This embodiment can reduce the dark current and whit spot in dark due to the contaminant metals to thereby improve the imaging properties.

In particular, the provision of the gettering region GET in the surface of the active region AcG can effectively remove the contaminant metals even in the low-temperature process. For example, when a related art gettering layer is positioned deeply in a depth of 10 μm or more using the above BMD technique, the contaminant metals diffuse into the gettering layer in the low-temperature process to cause the dark current or white spot in dark. The use of the above BMD technique is also disadvantageous in terms of cost.

Together with the increase in number of pixels and with the higher definition of the image, the speedup of calculation of the logical circuit (logic) in the peripheral circuit region 2A has been increasingly required. This needs microfabrication of the logical circuit (logic) in the peripheral circuit region 2A. For example, it is necessary to achieve the microfabrication of a gate length and the source and drain regions. In order to form such a fine element, the high-temperature process cannot be performed, and the low-temperature process (low thermal budget process) becomes essential. As the process temperature is decreased, the gettering effect exhibited in the relatively deep position, like the BMD technique, becomes lower.

In contrast, this embodiment has the gettering region GET provided in the superficial part of the active region AcG, and thus can effectively remove the contaminant metals even in the low-temperature process.

In this embodiment, the gettering region GET is provided using the feeder region (active region AcG) for applying the ground potential GND, and hence can improve the imaging properties without adding another region for gettering. In other words, this embodiment can decrease an area of the pixels, and can also achieve the high density of pixels.

The p-type well PWL for applying the ground potential GND leads to a lower part of the pixel array via a lower part of the element isolation region LCS. Thus, the feeder region for applying the ground potential GND can be provided around the pixel array. However, the capacity between the well and the substrate becomes a vibration pulse (noise) due to a change in well potential, which adversely affects an output signal. When the capacity between the well and the substrate differs depending on the position of the pixel array, imaging properties fluctuates. Thus, preferably, the feeder region (active region AcG) for applying the ground potential GND is provided inside the pixel array, which reduces fluctuations in well potential and in imaging properties depending on the position. The gettering region GET has the sufficient electrical conductivity, and thus never interrupts the application of the ground potential GND. Thus, the active region AcG in this embodiment serves as both the feeder region for applying the ground potential GND and the gettering region GET.

Figure 44A:
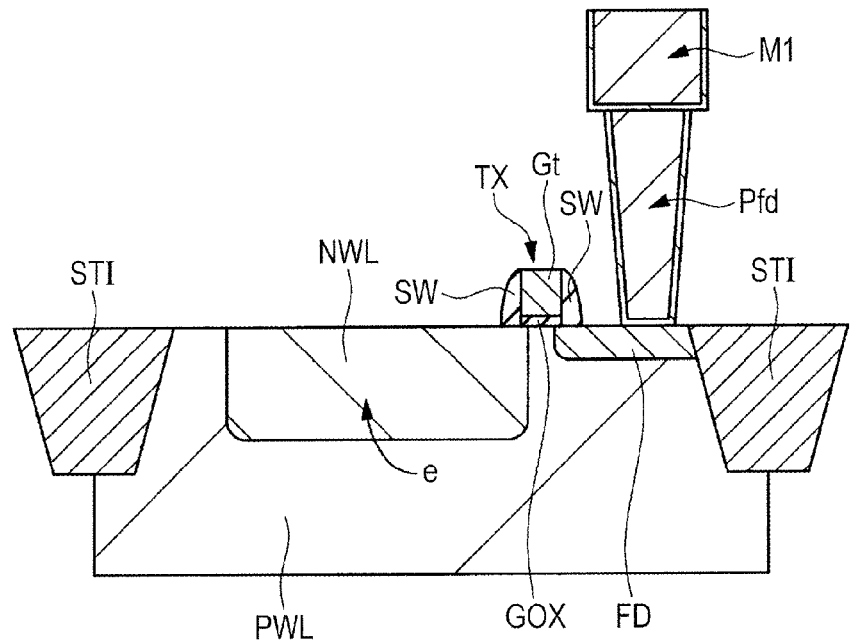
FIGS. 44A and 44B are cross-sectional views schematically showing the state of electrons affected by contaminant metals.
Figure 44B:
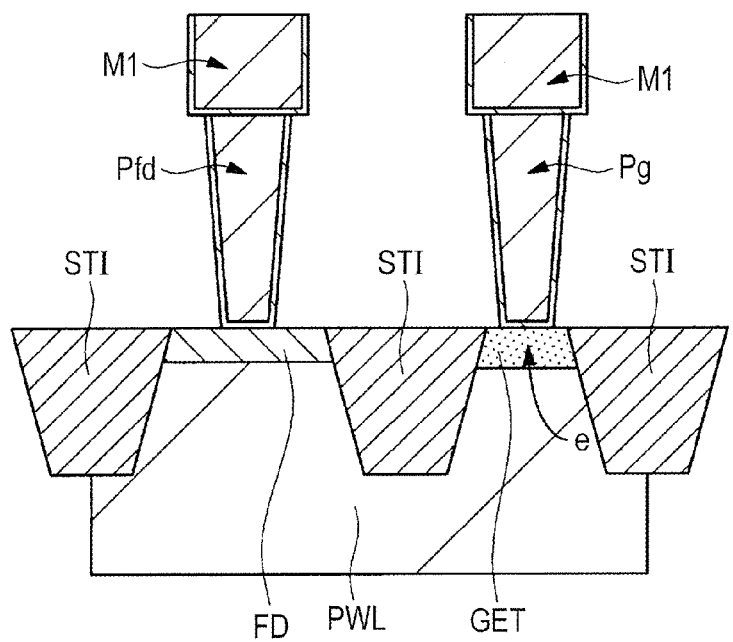

In this embodiment, the gettering region GET is provided in the feeder region (active region AcG) for applying the ground potential GND to thereby effectively reduce the dark current and white spot in dark. FIGS. 44A and 44B show schematically cross-sectional views of the state of electrons affected by the contaminant metal. As shown in FIG. 44A, when the gettering region GET is not provided, electron (e) generated from the contaminant metal of the p-type well PWL is trapped in the n-type well NWL forming the photodiode (PD) to become the dark current. In contrast, as shown in FIG. 44B, when the gettering region GET is provided like this embodiment, the contaminant metal is drawn by and trapped in the gettering region GET. Further, even if the electron (e) is generated from the contaminant metal, the electron (e) can be released via the contact Pg coupled to the ground potential GND. In this way, the electron (e) serving as a source for dark current can be easily removed.

In this embodiment, the feeder region (active region AcG, gettering region GET) is surrounded by the element isolation region using the LOCOS method or STI method in the plan view, which can easily achieve the microfabrication. For example, as disclosed in the above-mentioned Patent Document 1, the gettering layer can be isolated from other parts by using PN junction isolation. In fine patterning for the PN junction isolation, however, the breakdown voltage might be degraded. The PN junction isolation performs isolation only by using a difference in potential between respective regions, so that an electron (or hole) is more likely to flow into the photodiode PD via the level formed by the trapped metal. In order to reduce the influence of the level due to the metal element, it is necessary to apply a high voltage so as to set the potential higher. This make it difficult to save power.

In contrast, the element isolation using the LOCOS method or STI method in this embodiment can easily achieve the microfabrication and power saving. As to electric characteristics, this embodiment can effectively reduce the influx of electrons (or holes) of the metal trapped into the photodiode PD. Thus, this embodiment can reduce the dark current and white spot in dark due to the contaminant metals to thereby improve the imaging properties.

In this embodiment, the silicide film SIL is formed over the gettering region GET. In other words, the gettering region GET is provided to be in contact with the lower surface of the silicide film SIL. The contact Pg is provided to be in contact with the upper surface of the silicide film SIL.

Figure 45:
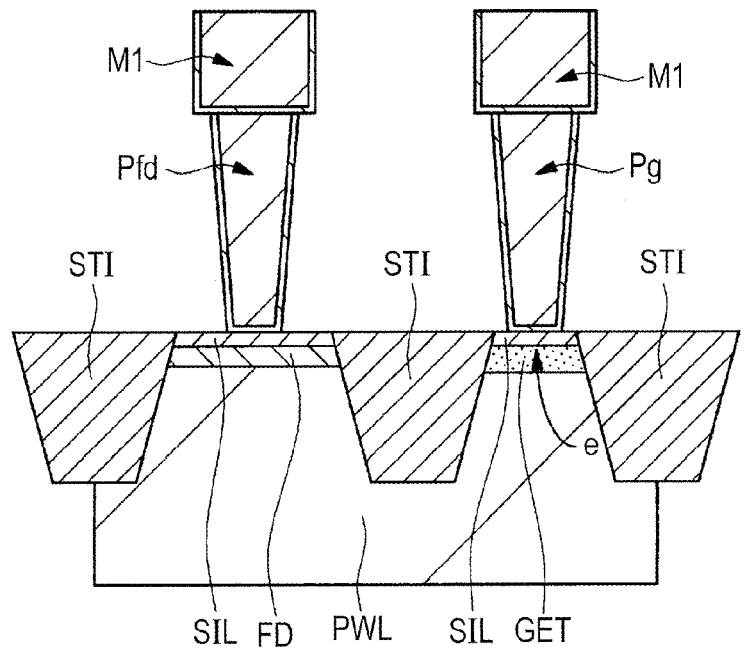
FIG. 45 is a cross-sectional view schematically showing the state of electrons affected by contaminant metals in providing a silicide film.
Figure 46:
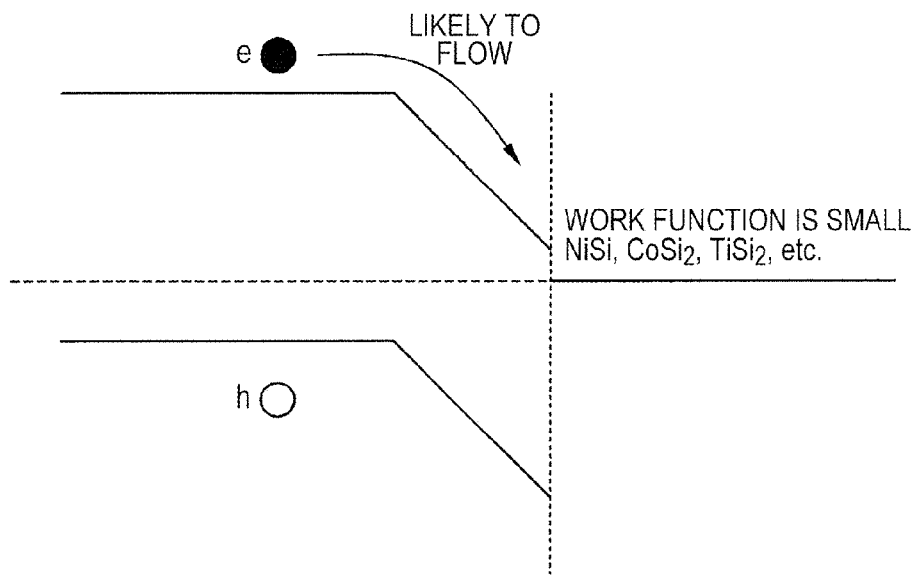
FIG. 46 is a band diagram showing potentials in a gettering region and a region in vicinity of metal silicide.

In this way, a metal silicide whose work function is smaller than that of Si (silicon) is formed over the gettering region GET, which allows electrons (e) of the contaminant metals to easily flow into the contact Pg. FIG. 45 schematically shows a cross-sectional view of the state of electrons affected by contaminant metals in providing a silicide film. FIG. 46 shows a band diagram of potentials in the gettering region and a region in vicinity of the metal silicide.

As shown in FIG. 46, the trapped metals forming a level in a forbidden band could act as a source for the generation of electrons (e). Even though the electrons (e) are generated, the electron (e) will be likely to flow into the metal silicide with a smaller work function. Thus, the electrons (e) can be effectively released through the metal silicide via the contact Pg (see FIG. 45). As a result, the electrons serving as a source for dark current can be easily removed.

The gettering region GET is not formed under the silicide film SIL of the floating diffusion FD, which can suppress the trapping of the electrons (e) from the contaminant metals in the floating diffusion FD. For example, when the gettering region GET is formed under the silicide film SIL of the floating diffusion FD, the electrons (e) from the metal forming the level in the forbidden band might flow into the floating diffusion FD to cause the dark current.

As mentioned above, the gettering region GET is not formed under the silicide film SIL of the floating diffusion FD, and the silicide film SIL is formed over the gettering region GET, which can effectively remove the electrons (e) from the contaminant metals.

Figure 47:
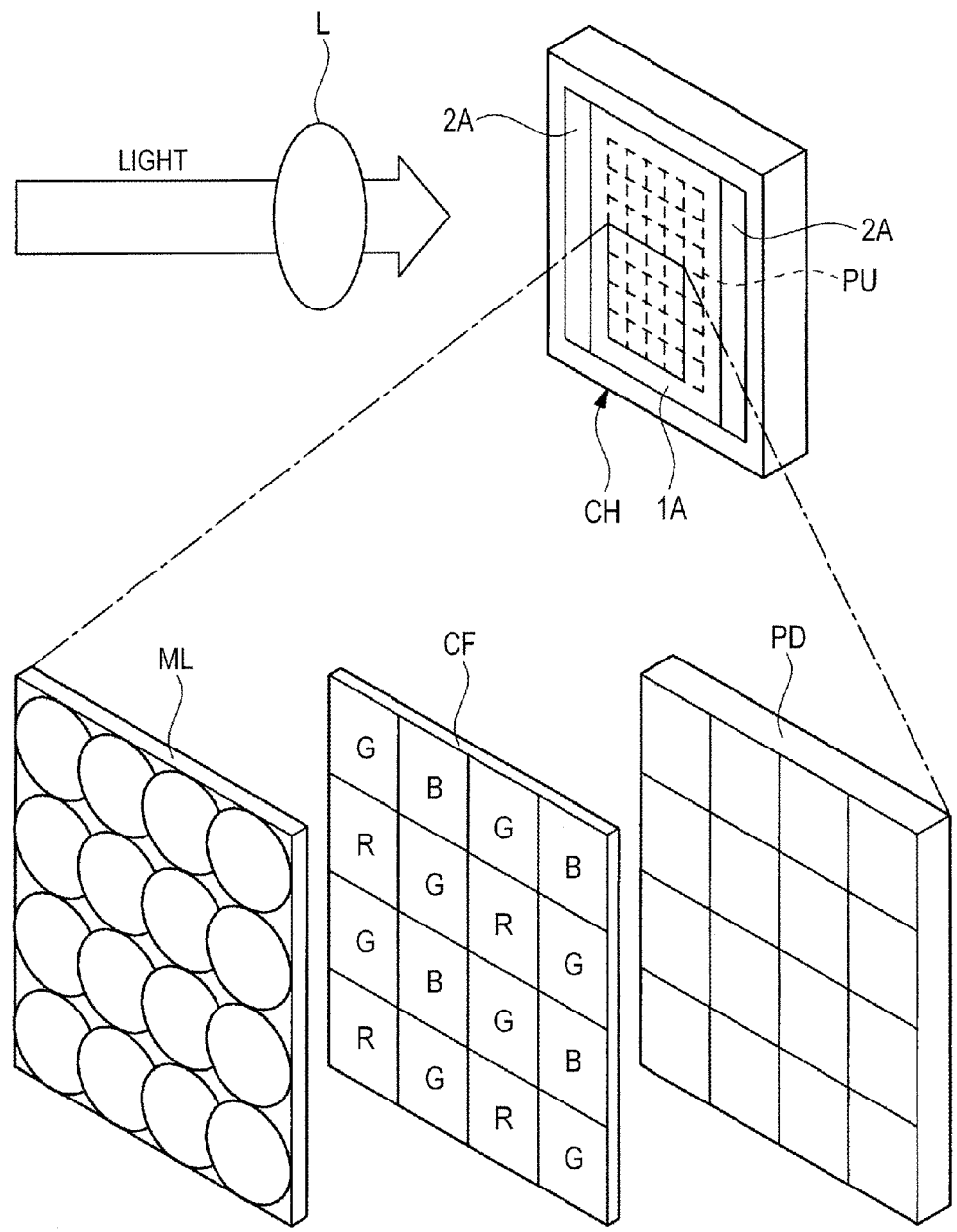
FIG. 47 is a schematic diagram showing the state of photoelectric conversion of an image sensor.

Next, the main structure of the image sensor and color filter will be described below. FIG. 47 shows a schematic diagram of the photoelectric conversion of the image sensor. As shown in FIG. 47, the image sensor (chip region CH) is disposed in the position of image formation of the lens L. Light emitted from a subject enters the lens L and forms an image. The image formed by the lens L is applied to the image sensor.

In the image sensor, as mentioned above, the incident light is converted into an electric signal, which is then processed to generate the image. The signal processing is performed, for example, using a logical circuit (logic) for signal computation formed in the peripheral circuit region 2A.

The image sensor includes the microlens ML and the photodiode PD as mentioned above (see FIG. 38).

The microlens ML allows the incident light to converge on a light receiving surface and irradiates the photodiode PD with the light. Thus, incident light in a wide range including the respective incident lights corresponding to gaps between the photodiodes PD (for example, formation regions of the reset transistor RST, the selection transistor SEL, and the amplifier transistor AMI, see FIGS. 3 and 4) can be applied to the photodiodes PD to effectively achieve the photoelectric conversion.

The photodiode PD can distinguish between light and dark of the light, but does not have a function of identifying the color. Thus, in order to form a color image, it is necessary to use a color filter CF. The color filter CF includes primary color filters using the so-called "light's three primary colors" consisting of red, green, and blue (RGB). Such primary color filters are disposed in front of the photodiode PD, causing the photodiode PD to correspond to the respective colors. For example, the photodiode PD disposed in front of the "red" color filter CF detects the amount of light for red, the photodiode PD disposed in front of the "green" color filter CF detects the amount of light for green, and the photodiode PD disposed in front of the "blue" color filter CF detects the amount of light for blue.

Various colors can be generated by adding and mixing the "light's three primary colors" in accordance with the amount of light of the photodiode PD corresponding to each color. As the color filter CF, a complementary filter may sometimes be used in addition to the primary filter of RGB. A complementary filter is composed of four kinds of colors, for example, green (g) in addition to cyan (c), magenta (M), and yellow (Y).

Second Embodiment

Figure 48:
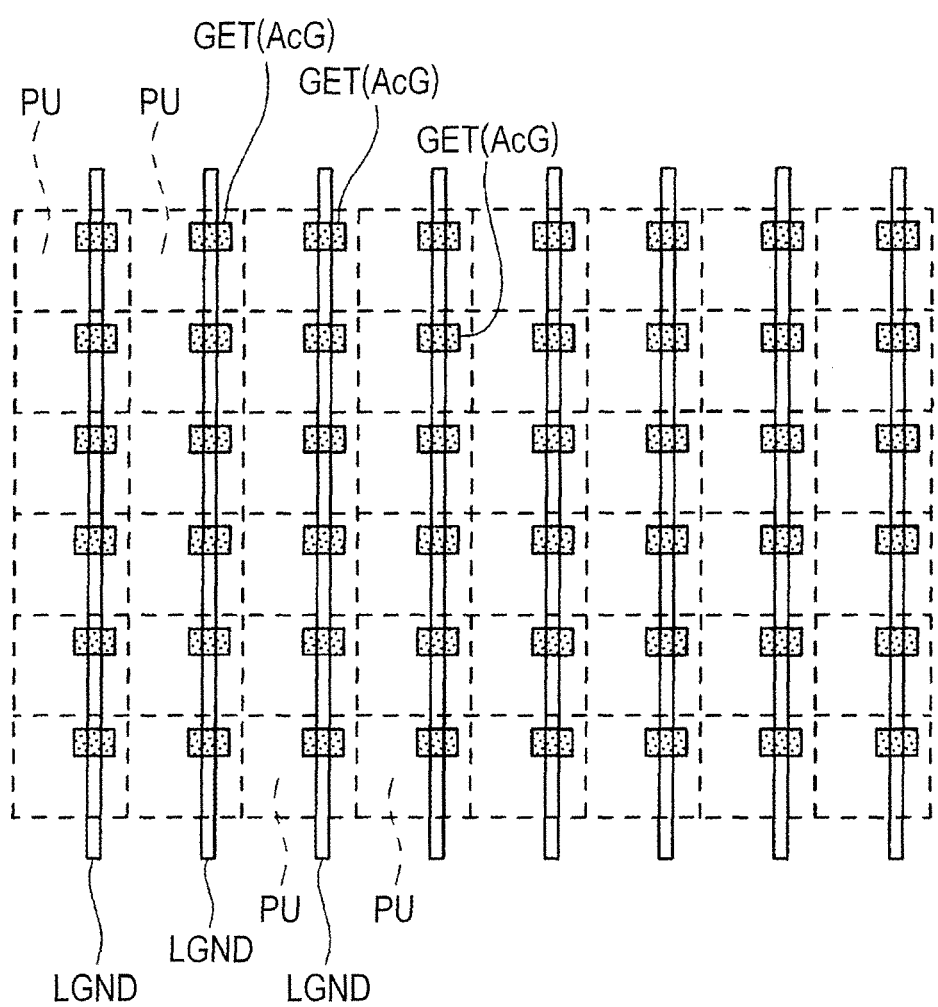
FIG. 48 is a plan view schematically showing the structure with one gettering region provided in one pixel in the first embodiment.
Figure 49:
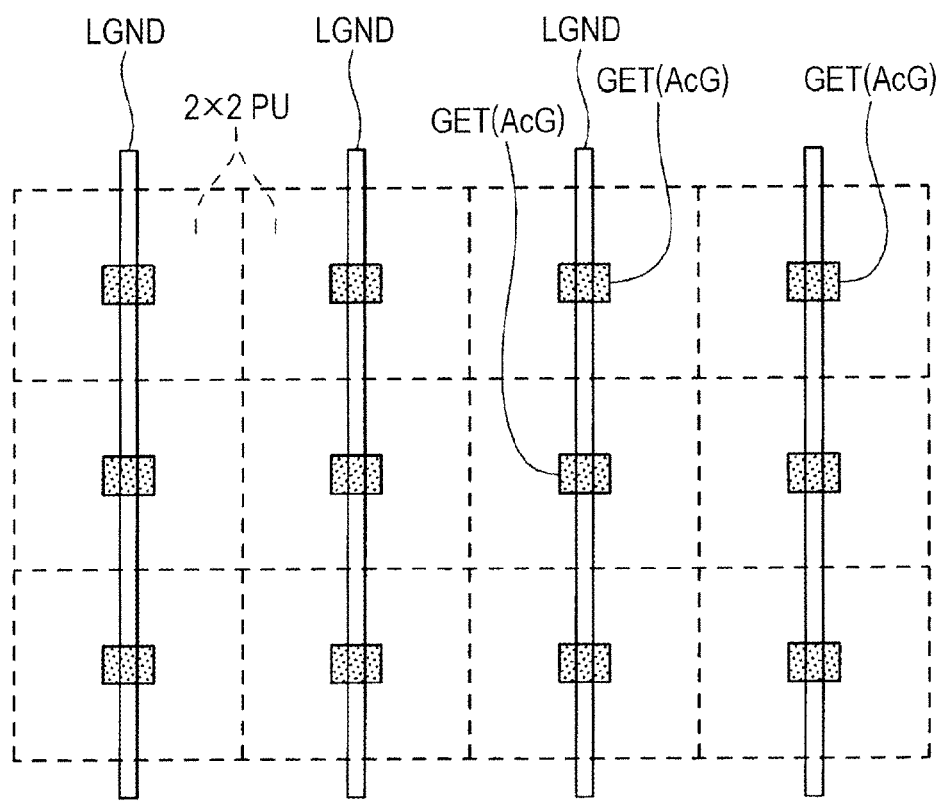
FIG. 49 is a plan view schematically showing the structure with one gettering region provided in a plurality of pixels in a second embodiment of the invention.
Figure 50:
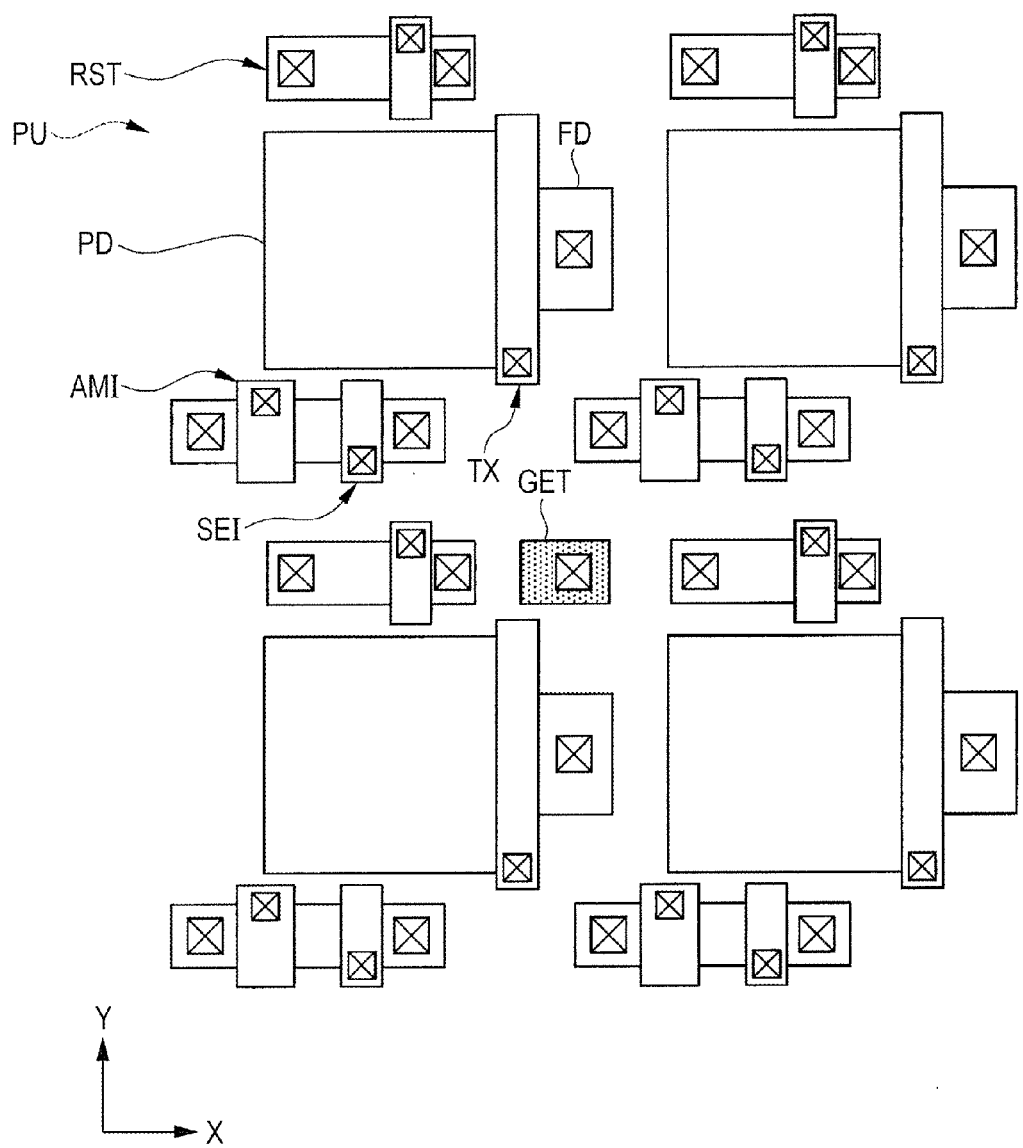
FIG. 50 is a plan view schematically showing the structure with one gettering region provided in a plurality of pixels in the second embodiment.
Figure 51:
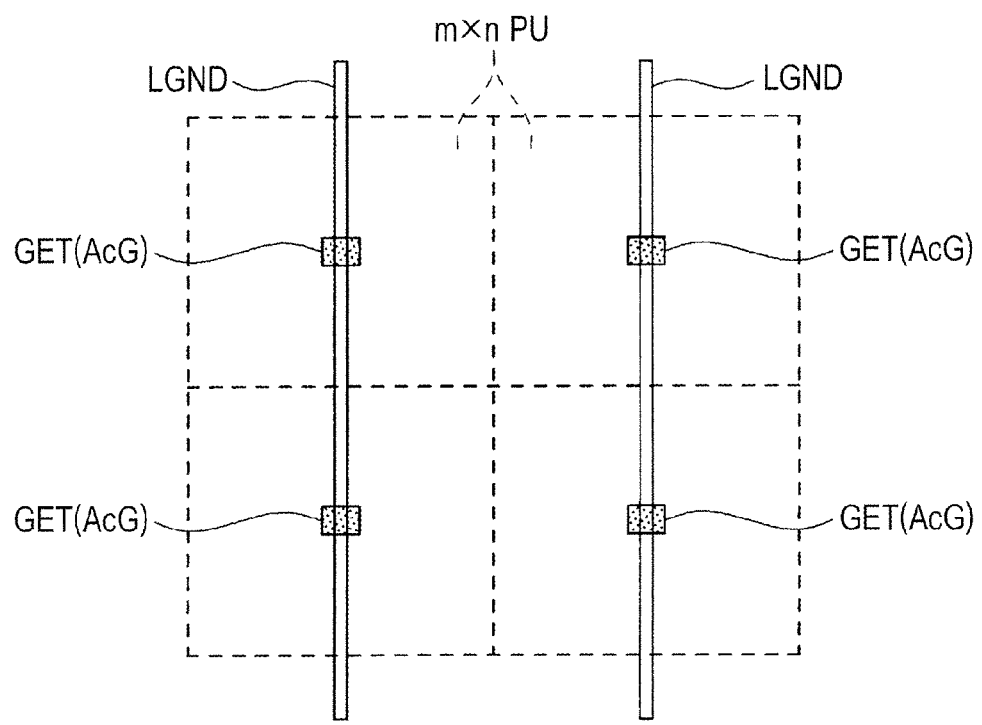
FIG. 51 is a plan view schematically showing another structure with one gettering region provided in a plurality of pixels in the second embodiment.

Although one gettering region GET is provided in one pixel PU in the first embodiment, the gettering region GET may be provided every region with pixels. FIG. 48 schematically shows a plan view of the structure with one gettering region provided in one pixel in the first embodiment. FIGS. 49 and 50 show plan views of the structure with one gettering region provided in the pixels in the second embodiment. FIG. 51 schematically shows a plan view of another structure with one gettering region provided in the pixels in the second embodiment.

First, as shown in FIG. 48, in the first embodiment, one gettering region GET (active region AcG) is provided in one pixel PU (see FIGS. 3 and 7). The ground potential line LGND is disposed to be coupled to the contact over the gettering region GET. Although in the first embodiment, the gettering region GET is provided in each of all active regions (feeder region) AcG provided in respective pixels PU, the gettering region GET may be provided in parts of the active regions (feeder regions) AcG provided in respective pixels PU.

In contrast, in this embodiment, the gettering regions GET are provided every pixels (see FIGS. 49 and 50).

Referring to FIG. 49, each gettering region GET (active region AcG) is provided every four pixels of 2×2. The gettering region GET is positioned in the center of the four pixels PU. In other words, the four pixels share one gettering region GET. Specifically, the gettering region GET (active region AcG) can be disposed in the substantial center of the region with four pixels of 2×2 as shown in FIG. 50.

For example, as shown in FIG. 47, the color filter array consists of the repetition of one group (pixel unit) consisting of two green G color filters and remaining color filters among the light's three primary colors, namely, the color filters R, G, G, and B. In this case, the four pixels share the gettering region GET, which facilitates the design of the layout. The above arrangement can achieve the reduction in area of the pixel, and the increase in density of pixels, and can ensure the large formation region for the photodiode PD in each pixel to thereby improve the light receiving sensitivity. An area of a region for drawing wirings in one pixel can be increased, which can ensure the large distance between the wirings to prevent the inconveniences, including short circuit, and reduction in capacity between the wirings.

The above four pixels (pixel unit) may share not only the gettering region GET, but also the reset transistor RST, the selection transistor SEL, and the amplifier transistor AMI.

Referring to FIG. 51, in a pixel region (pixel array) 1A with the pixels PU in M×N array (in M rows and N columns, namely, M pieces in the direction X and N pieces in the direction Y), the gettering region GET (active region AcG) is provided every m×n pixels PU. The M, N, m, and n are natural numbers. Also, in this case, the gettering region GET can be provided in the substantial center of the region with the m×n pixels. In this way, the gettering region GET is provided every unit of repetition, which facilitates the design of the layout. This embodiment can achieve the reduction in area of the pixels, and the increase in density of the pixels, and can ensure the large formation region for the photodiode PD in each pixel to thereby improve the light receiving sensitivity. Further, this embodiment can increase the area of drawing the wirings in one pixel. Thus, the large distance between the wirings can be ensured to prevent the inconveniences, including short circuit, and reduction in capacity between the wirings.

Figure 52:
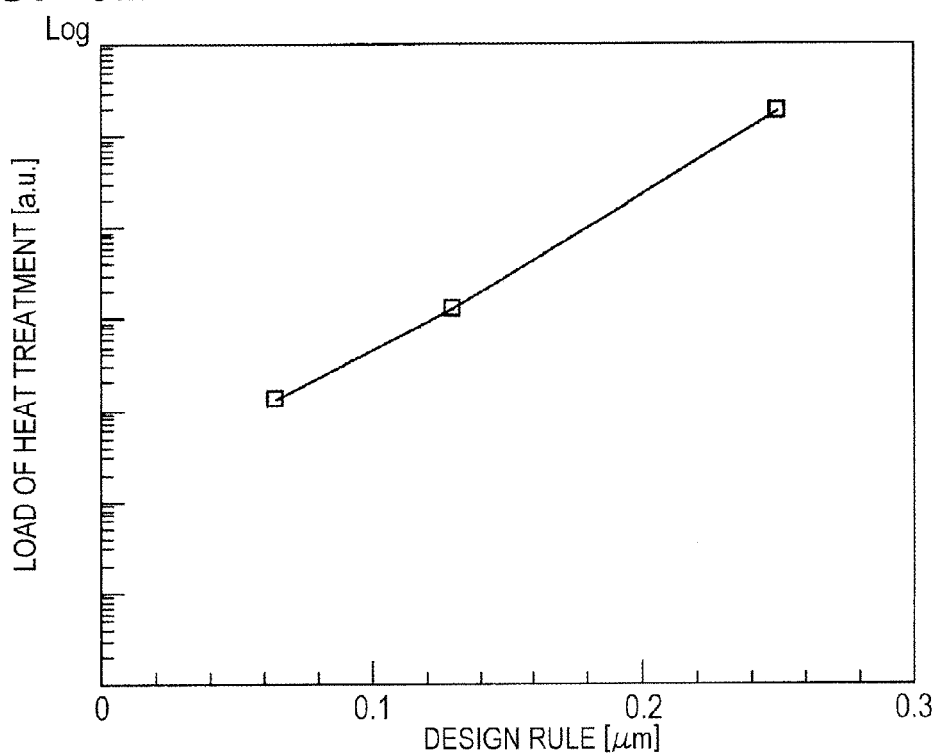
FIG. 52 is a graph showing a load of heat treatment with respect to a design rule.
Figure 53:
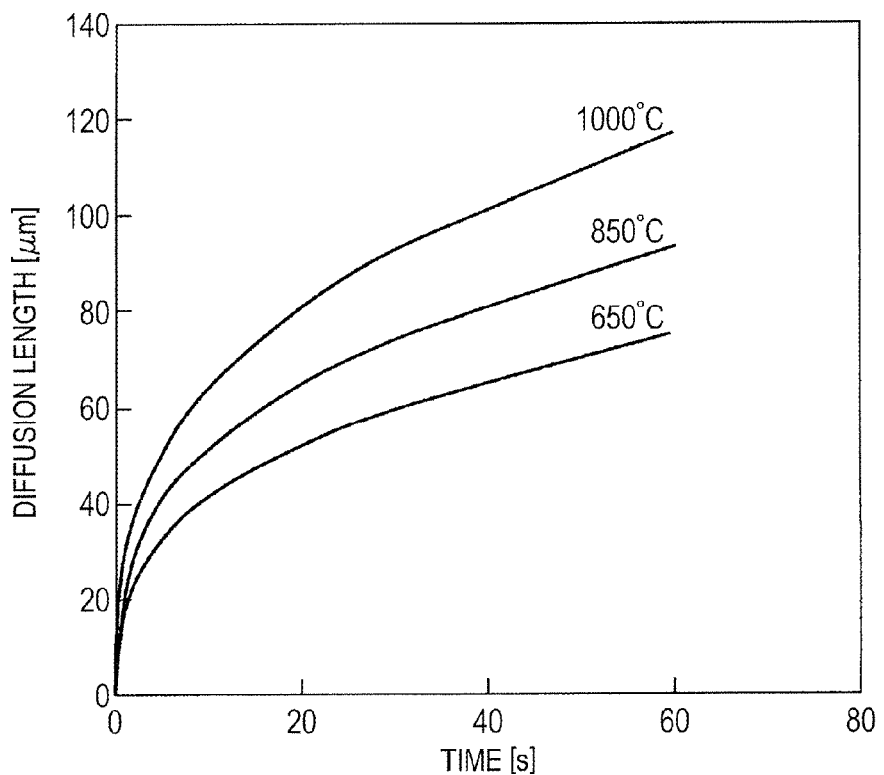
FIG. 53 is a graph showing the relationship between the heat treatment time and the diffusion length.
Figure 54:
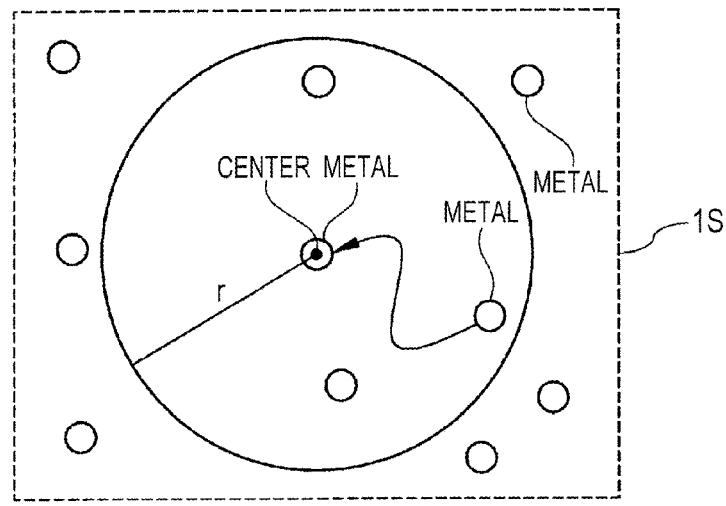
FIG. 54 is a plan view showing a region in which contaminant metals can be trapped.

Next, a preferable specific value of the region with m×n pixels will be described below. FIG. 52 shows a graph of a load of heat treatment (maximum temperature of the heat treatment×time) with respect to a design rule. FIG. 53 shows a graph of the relationship between the time of heat treatment applied to a metal element, such as a Ni atom, whose diffusion coefficient is large, and the distance at which the metal element can be trapped in the gettering region. FIG. 54 schematically shows a plan view of the region in which the contaminant metals can be trapped.

As shown in FIG. 52, as the design rule [μm], that is, the minimum line width or space width available in the peripheral circuit region 2A (for example, gate length of the transistor LT) is decreased, the load of the heat treatment (in FIG. 42, indicated by a value in any units of [a.u.] on the longitudinal axis) becomes smaller. This is because not only the gate length, but also the diffusion region, such as the source and drain regions, need to be fine-patterned in order to form the fine transistor as mentioned above.

As shown in FIG. 53, as the heat treatment temperature or the time for heat treatment (annealing) [s] is decreased, the length [μm] of metal that can be trapped in the gettering region becomes smaller.

As shown in FIG. 54, when the region that can trap the contaminant metal (Metal) therein is within a radius r from the center of the gettering region, the gettering region GET is preferably provided every gettering effective area represented by r (diffusion length)×r×3.14.

For example, the gettering region inside the semiconductor substrate 1A is formed by the BMD technique in a depth of about 7 to 10 μm. The gettering region provided by a polyback seal technique, on the backside of the semiconductor substrate 1S is formed in a depth of about 725 μm.

Thus, for example, by setting the r to 10 μm or less, the gettering effect can be more effectively exhibited as compared to the effect given by the above gettering region (BMD technique, polyback seal technique). In other words, the gettering region GET of this embodiment can trap therein the contaminant metals that cannot be trapped in the above related art gettering region (BMD technique, polyback seal technique).

For example, when the region of one pixel PU is 5 μm×5 μm, the gettering region GET is formed every 10 to 13 pixels from the effective gettering area in a range of 7 μm×7 μm×3.14 to 10 μm×10 μm×3.14, which can more effectively exhibit the gettering effect as compared to the above related art gettering region (BMD technique, polyback seal technique). For example, when the region of one pixel PU is 3 μm×3 μm, one gettering region GET is formed every 17 to 35 pixels from the effective gettering area in a range of 7 μm×7 μm×3.14 to 10 μm×10 μm×3.14, which can more effectively exhibit the gettering effect as compared to the above related art gettering effect (BMD technique, polyback seal technique).

When the metals containing atoms heavier than a Ni (nickel) atom might cause the metal contamination, the diffusion coefficient of the metal becomes very small. By increasing the ratio of formation of the gettering region GET, the gettering effect can be more effectively exhibited.

Third Embodiment

Although in the first embodiment, the gettering region GET is provided using the feeder region (active region AcG) for applying the ground potential GND, a gettering region GET may be provided independently from the feeder region (active region AcG).

Figure 55:
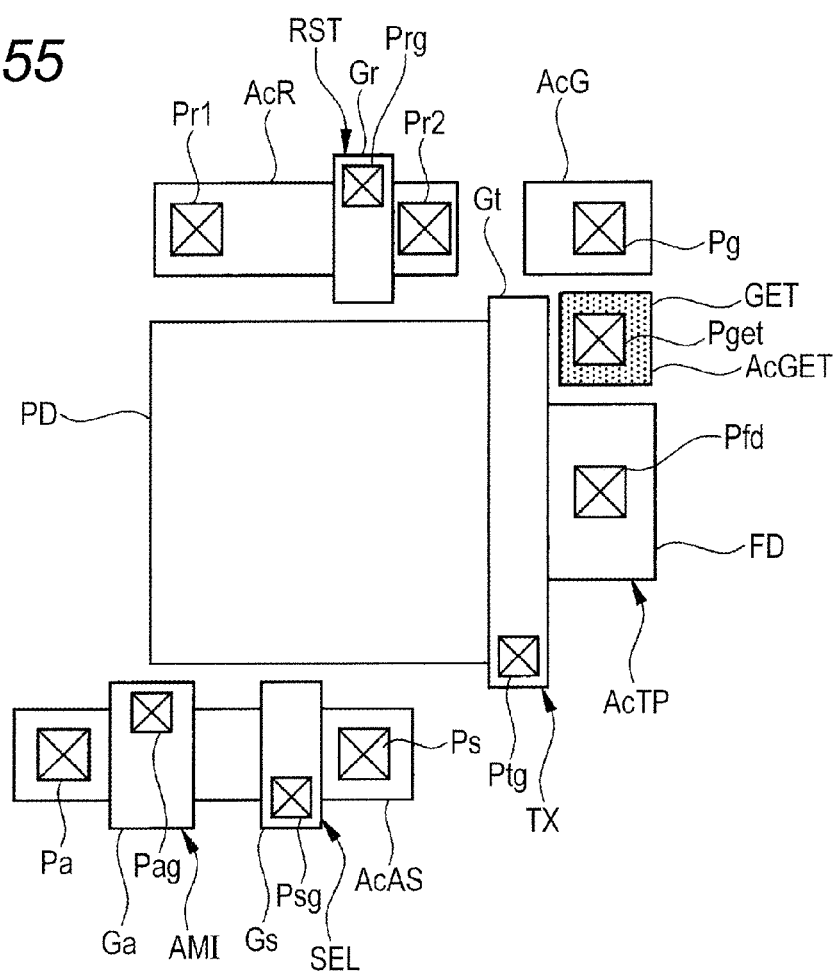
FIG. 55 is a plan view showing a pixel of a semiconductor device according to a third embodiment of the invention.

FIG. 55 shows a plan view of a pixel of a semiconductor device in this embodiment. As shown in FIG. 55, apart from the feeder region (active region AcG) for applying the ground potential GND, another active region AcGET is provided with the gettering region GET formed over the surface thereof. The structures of other components are the same as those in the first embodiment described with reference to FIG. 3, and thus a description thereof will be omitted below.

In this embodiment, apart from the feeder region (active region AcG), another active region AcGET for the gettering region GET is provided, which eliminates the necessity of coupling the active region AcGET to the ground potential GND. Referring to FIGS. 44B and 45, electrons from the contaminant metals can be effectively released via the contact coupled to the ground potential GND. For this reason, preferably, the contact Pget is disposed over the active region AcGET, and coupled to the ground potential line (LGND).

Now, the structures of the feeder region (active region AcG) for applying the ground potential GND, and the gettering region GET formed over the surface of the active region AcGET will be described below. The feeder region (active region AcG) is an exposed region of the p-type well PWL leading to a lower part of the pixel array via a lower part of the element isolation region LCS. Thus, the feeder region (active region AcG) is an implantation region of p-type impurities, such as boron (B). In contrast, the gettering region GET described in the first embodiment is a region into which impurities for gettering, such as carbon (C) or boron (B), are implanted. Implantation of such impurities causes crystal defects (for example, rearrangement) or distortion in the region, into which the contaminant metals can be trapped and fixed. The gettering region is a region with a gettering site. The gettering region GET has more crystal defects or distortion (gettering sites) than the normal feeder region (active region AcG).

Fourth Embodiment

Although the first embodiment uses a frontside illuminated image sensor for allowing light to enter from the front surface (formation surface of the gate electrode Gt) of the semiconductor substrate 1S, a back-side illuminated image sensor for allowing light to enter from the back surface of the semiconductor substrate may be employed.

Figure 56:
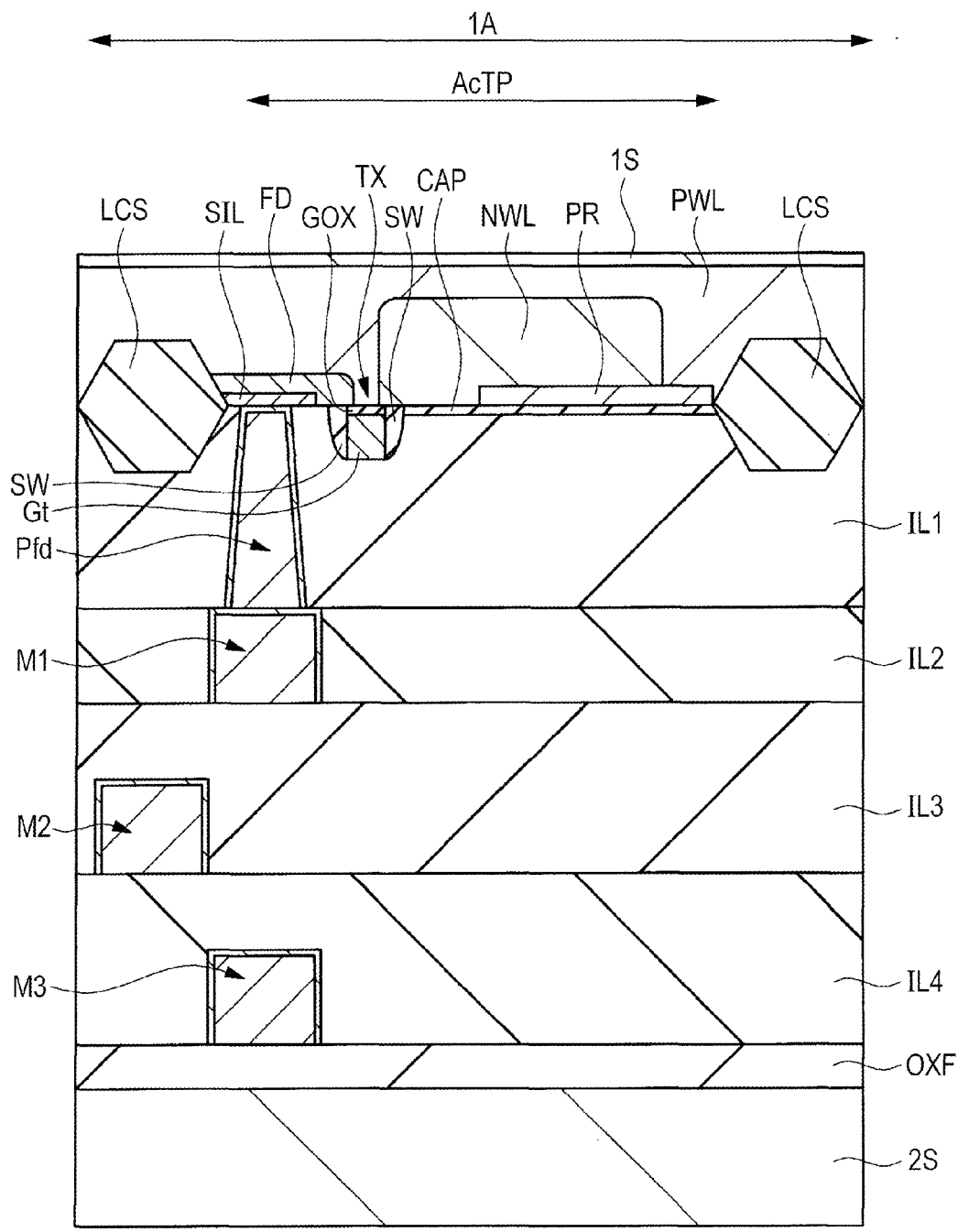
FIG. 56 is a cross-sectional view showing the semiconductor device structure according to a fourth embodiment of the invention.

FIG. 56 shows a cross-sectional view of the semiconductor device structure of this embodiment. For example, FIG. 56 corresponds to a cross-sectional view taken along the line A-A of FIG. 3. The semiconductor structure shown in FIG. 56 is substantially the same as the device structure in the first embodiment shown in FIG. 38.

This embodiment shown in FIG. 56 is the same as the first embodiment (shown in FIG. 38) in that the photodiode (p-type well PWL and n-type well NWL, PD) and the transfer transistor TX are formed in the semiconductor substrate 1S. The interlayer insulating films (IL1 to IL4) and the wiring layers (M1 to M3) are formed over the surface (lower side shown in FIG. 56) of the semiconductor substrate 1S.

In this embodiment, a bonding film OXF is formed under the interlayer insulating film IL4, and the support substrate 2S is disposed under the bonding film OXF.

The semiconductor substrate 1S of this embodiment is thinner than that in the first embodiment. The back side of the semiconductor substrate 1S (upper side shown in FIG. 56) may be the $p^+$-type semiconductor region. A microlens (not shown) is mounted over the back side of the semiconductor substrate 1S via the reflection preventing film or color film.

In this case, the light entering the back side of the semiconductor substrate 1S is applied to the photodiode (PD) in the semiconductor substrate 1S via the microlens and color filter or the like.

The back-side illuminated image sensor allows the incident light to effectively reach the photodiode to improve the imaging properties as compared to the frontside illuminated image sensor.

In this way, also in the back-side illuminated image sensor, as shown in FIG. 3, the gettering region GET can be provided in the feeder region (active region AcG) in the one pixel PU. Alternatively, the gettering region GET can be provided every region with pixels.

Thus, like the first embodiment, this embodiment can effectively remove the contaminant metals even under the low-temperature process and can also improve the imaging properties without increasing the region for gettering. This embodiment can include the gettering region GET using the feeder region (active region AcG) for applying the ground potential GND to thereby effectively reduce the dark current and white spots in dark.

Fifth Embodiment

In the first embodiment, the gettering region GET is provided in the surface of the active region AcG (see FIG. 9 and the like). In addition to the gettering region GET formed in the surface of the semiconductor substrate 1S, another gettering region GET1 (by the BMD technique) inside the semiconductor substrate 1S (under the element formation layer), or another gettering region GET2 (by the polyback seal technique) may be provided on the back side of the semiconductor substrate 1S.

For example, the gettering region GE1 is formed inside the semiconductor substrate 1S in the following way. First, carbon (c) atoms are doped into the surface of the silicon substrate to form the gettering region GET1. Then, an epitaxial layer for element formation is formed over the gettering region GET1. The semiconductor device (CMOS image sensor) described in the first embodiment or the like is formed in the epitaxial layer. Thus, the semiconductor device can be formed which includes the gettering region GET in the surface of the active region AcG, and another gettering region GET1 under the epitaxial layer for element formation.

A polysilicon is previously formed as another gettering region GET2 over the back side of the semiconductor substrate 1S. The semiconductor device (CMOS image sensor) described in the first embodiment or the like is formed over the semiconductor substrate 1S. In this way, the semiconductor device can be formed which includes the gettering region GET in the surface of the active region AcG and another gettering region GET2 at the back side of the semiconductor substrate 1S.

The above gettering regions GET1 and GET2 might possibly be removed in a step of polishing the back side of the semiconductor substrate 1S. In contrast, the gettering region GET in the surface of the active region AcG remains. As described in detail in the first embodiment or the like, the gettering region GET remains, which is not problematic, and the ground potential GND can be applied to the gettering region GET to improve the gettering effect.

By the use of both the gettering region GET in the surface of the active region AcG and the above gettering regions GET1 and GET2, the gettering region GET in the surface of the active region AcG can trap therein the contaminant metals missed by the gettering regions GET1 and GET2 located in the relatively deep position from the element formation portion even when the diffusion length becomes smaller with the development of the low-temperature process. For example, the gettering region GET1 is positioned in a depth of about 7 to 10 µm from the surface of the element formation portion. The gettering region GET2 is positioned in a depth of about 725 µm from the surface of the element formation portion. In particular, even the gettering region GET1 formed in a relatively shallow position needs to form the epitaxial layer for element formation over the region GET1, which makes it difficult to form the gettering region GET1 in the shallower position. In contrast, the gettering region GET in the surface of the active region AcG can be easily achieved in the low-temperature process for the microfabrication, and has the great gettering effect as compared to other gettering regions GET1 and GET2.

As described above, in addition to the gettering region GET at the surface of the semiconductor substrate 1S, the gettering region GET1 inside (under the element formation layer) of the semiconductor substrate 1S, or the gettering region GET2 over the back side of the semiconductor substrate 1S may be used.

Although the invention made by the inventors have been specifically described based on the preferred embodiments, it is apparent that the invention is not limited to the described embodiments, and that various modifications and changes can be made to those embodiments without departing from the scope of the invention.

The above embodiments can be described by the following additional remarks, but the scope of the invention is not limited by the additional remarks below.

[Additional Remarks]
[Additional Remark 1]

The invention provides a semiconductor device, including;

a pixel array with a plurality of M×N pixels (M and N being natural numbers) arranged in an array, the pixel including a photodiode for generating a charge by receiving light, and a gate electrode for a transfer transistor for transferring the charge generated by the photodiode, wherein the photodiode and the gate electrode are disposed in a first active region, wherein the semiconductor device further includes a second active region which is formed in a region different from the first active region and in which the gettering region is disposed, and wherein the second active region is disposed every region with m×n pixels (m and n being nature numbers).

[Additional Remark 2]

In the semiconductor device described in the additional remark 1, a contact to which a ground potential is applied is disposed over the second active region.

[Additional Remark 3]

In the semiconductor device described in the additional remark 2, the first active region and the second active region are respectively surrounded by an element isolation region made of an insulator in a plan view.

[Additional Remark 4]

The semiconductor device described in the additional remark 3, further includes a silicide layer provided in the second active region, wherein the gettering region is provided so as to be in contact with a lower surface of the silicide layer, and wherein the contact is provided so as to be in contact with an upper surface of the silicide layer.

[Additional Remark 5]

In the semiconductor device described in the additional remark 3, wherein the photodiode has a second semiconductor region disposed in a first semiconductor region, wherein the first semiconductor region extends up to the second active region, and wherein the ground potential is applied to the first semiconductor region via the contact.

[Additional Remark 6]

In the semiconductor device described in the additional remark 5, wherein the transfer transistor is an n-channel transistor.

[Additional Remark 7]

In the semiconductor device described in the additional remark 5, wherein the element isolation region is a LOCOS or STI.

What is claimed is:

1. A semiconductor device, comprising;
a semiconductor substrate having a main surface, the main surface including a first area and a second area, the first area and the second area being respectively surrounded by an element isolation region made of an insulator in a plan view;
a first semiconductor region of a first conductive type formed in the semiconductor substrate, the first semiconductor region extending at both the first area and the second area;
a gate electrode formed on the main surface of the semiconductor substrate at the first area;
a second semiconductor region of a second conductive type opposite to the first conductive type formed in the first semiconductor region at the first area to form a PN junction with the first semiconductor region, the second semiconductor region being disposed at one side of the gate electrode in the plan view;
a third semiconductor region of the second conductive type formed in the first semiconductor region at the first area and being disposed at the other side of the gate electrode in the plan view;
a gettering region formed in the first semiconductor region at the second area;
a first silicide layer formed on the gettering region; and
a contact plug formed on the gettering region and electrically coupled to the first semiconductor region via the first silicide layer,
wherein a transfer transistor for transferring a charge generated by a photo diode including the PN junction is comprised of the second semiconductor region, the gate and the third semiconductor region, wherein the gettering region is a diffused region including carbon as impurity, and wherein a ground potential is applied to the contact plug.

2. The semiconductor device according to claim 1; wherein the first silicide is nickel silicide film.

3. The semiconductor device according to claim 1, further comprising a second silicide layer formed on the third semiconductor region, wherein the second silicide layer is formed of a same layer as that of the first silicide layer.

4. The semiconductor device according to claim 1; wherein the gettering region further includes boron as impurity of the first conductive type.

5. The semiconductor device according to claim 1, wherein the gettering region is provided to be in contact with a lower surface of the first silicide layer, and wherein the contact plug is provided to be in contact with an upper surface of the first silicide layer.

6. The semiconductor device according to claim 1, wherein the gettering region is located in a depth of 100 nm or less from a surface of the second active region.

7. The semiconductor device according to claim 1, wherein a carbon content of the gettering region is $1\times10^{19}/cm^3$ or more but $1\times10^{21}/cm^3$ or less, and wherein an atomic percentage of carbon replaced by a Si crystal lattice of the gettering region is 0.1% or more but 1.5% or less.

8. The semiconductor device according to claim 1, wherein the element isolation region is a LOCOS or an STI.

* * * * *